United States Patent
Kadkade et al.

(10) Patent No.: US 7,290,193 B2
(45) Date of Patent: Oct. 30, 2007

(54) SYSTEM VERIFICATION USING ONE OR MORE AUTOMATA

(76) Inventors: Sudhir Dattaram Kadkade, 4970 SW Centerwood St., Lake Oswego, OR (US) 97035; Clifton Alton Lyons, Jr., 14463 Pfeifer Dr., Lake Oswego, OR (US) 97035

( * ) Notice: Subject to any disclaimer, the term of this patent is extended or adjusted under 35 U.S.C. 154(b) by 253 days.

(21) Appl. No.: 10/957,259

(22) Filed: Sep. 30, 2004

(65) Prior Publication Data
US 2005/0071720 A1 Mar. 31, 2005

Related U.S. Application Data

(60) Provisional application No. 60/507,570, filed on Sep. 30, 2003.

(51) Int. Cl.
*G01R 31/28* (2006.01)
(52) U.S. Cl. .................... 714/742; 714/741
(58) Field of Classification Search ............. 714/25, 714/37, 724, 738, 741, 742
See application file for complete search history.

(56) References Cited

U.S. PATENT DOCUMENTS

| | | | |
|---|---|---|---|
| 6,226,716 B1 * | 5/2001 | Bauman et al. ............. 711/145 |
| 6,385,750 B1 * | 5/2002 | Kapur et al. ................ 714/738 |
| 6,707,313 B1 * | 3/2004 | Rohrbaugh et al. ......... 324/765 |
| 2002/0124208 A1 * | 9/2002 | Beer et al. .................... 714/37 |
| 2003/0159132 A1 * | 8/2003 | Barnett et al. .............. 717/124 |
| 2004/0019839 A1 * | 1/2004 | Krech et al. ................. 714/724 |
| 2006/0047461 A1 * | 3/2006 | Sivaram et al. ............. 702/120 |

OTHER PUBLICATIONS

Aharon, et al., "Verification of the IBM RISC System/6000 by a dynamic biased pseudo-random test program generator", IBM Systems Journal, vol. 30, No. 4, pp. 527-538, 1991.
Aharon, et al., "Test Program Generation for Functional Simulation of PowerPC Processors in IBM", Proceedings of the IEEE/ACM Design Automation Conference, pp. 279-285, 1995.
Ahi, et al., "Design Verification of the HP 9000 Series 700 PA0RISC workstations", Hewlett-Packard Journal, vol. 43, No. 4, pp. 34-42, Aug. 1992.
Aho, et al., "An Optimization Technique for Protocol Conformance Test Generation Based on UIO Sequences and Rural Chinese Postman Tours", IEEE Transactions on Communications, vol. 39, No. 11, pp. 1604-1615, 1991.
Alexander, et al., "Verification, Characterization, and Debugging of the HP PA 7200 Processor", Hewlett-Packard Journal, vol. 47, No. 1, article 4, Feb. 1996.
Anderson, Walker, "Logical Verification of the NVAX CPU Chip Design", Proceedings of the 1991 IEEE International Conference on Computer Design of VLSI in computer & Processors, pp. 306-309.
Apfelbaum, Larry, "Automated Functional Test Generation", Proceedings of the Autotestcon '95 Conference, pp. 101-107, 1995.

(Continued)

*Primary Examiner*—James C. Kerveros
(74) *Attorney, Agent, or Firm*—Klarquist Sparkman, LLP

(57) ABSTRACT

A method and apparatus for manipulating a non-deterministic automaton and a traversal of a non-deterministic automaton for dynamic verification of a system or device under test is described herein.

24 Claims, 27 Drawing Sheets

```
                                    ┌─ 2402

// Get class definitions, operator overloads, etc.
    1.  #include "ObjectClasses.h"
        // This function constructs a simple graph.
    2.  ConstructGraph() {
            // S1, S2, and S3 are declared as symbols.
            // "symbols" are also referred to as "non-terminals".
    3.      symbol(S1); symbol(S2); symbol(S3);
            // a, b, c, and d are declared as actions.
            // "actions" are also referred to as "terminals".
    4.      action(a); action(b); action(c); action(d);
            // e, f, and g are declared as actions.
    5.      action(e); action(f); action(g);
            // S2 is c followed by e.
    6.      S2 = c, e;
            // S3 is 1 to 3 repetitions of the sequence
            // of d and f.
    7.      S3 = repeat(( (d, f), min(1), max(3) ));
            // S1 starts with a followed by an infinite
            // loop of b, either S2 or S3, then g.
    8.      S1 = a, repeat(( b, (S2 | S3), g ));
            // Compile graph with S1 as start non-terminal into
            // a binary data file.
    9.      CompileGraph(S1, "binarygraph.dat");
            // End of function.
    10. }
```

OTHER PUBLICATIONS

Apfelbaum, Larry, "Spec-based tests make sure telecom software works", IEEE Spectrum, Nov. 1997.

Balcer, et al., "Automatic Generation of Test Scripts from Formal Test Specifications", Proceedings of the ACM SIGSOFT '89 3rd Symposium on Software Testing, Analysis, and Verification, pp. 210-218, 1989.

Bazzichi, et al., "An Automatic Generator for Compiler Testing", IEEE Transactions on Software Engineering, vol. SE-8, No. 4, pp. 343-353, Jul. 1982.

Bellon, et al., "Automatic Generation of Microprocessor Test Programs", Proceedings of the IEEE/ACM 19th Design Automation Conference, pp. 566-573, 1982.

Bird, et al., "Automatic generation of random self-checking test cases", IBM Systems Journal, vol. 22, No. 3, 1983.

Chandra, et al., "Architectural Verification of Processors Using Symbolic Instruction Graphs", Proceedings of International Conference on Computer Design, pp. 454-459, Oct. 1994.

Chandra, et al., "AVPGEN—A Test Generator for Architecture Verification", IEE Transactions on Very Large Scale Integration (VLSI) Systems, vol. 3, No. 2, pp. 188-200, Jun. 1996.

Chandrasekharan, et al., "Requirements-Based Testing of Real-Time Systems: Modeling for Testability", IEEE Computer, pp. 71-80, Apr. 1985.

Chanson, et al., "A Unified Approach to Protocol Test Sequence Generation", Proceedings of IEE INFOCOM-93, vol. 1, pp. 106-114, Mar. 1993.

Cheng, et al., "Automatic Functional Test Generation Using the Extended Finite State Machine Model", Proceedings of the IEE/ACM 30th Design Automation Conference, pp. 86-91, 1993.

DeMillo, et al., "Constraint-Based Automatic Test Data Generation", IEEE Transactions on Software Engineering, vol. 17, No. 9, Sep. 1991.

DeMillo, et al., "Experimental Results from an Automatic Test Case Generator", ACM Transactions on Software Engineering and Methodology, vol. 2, No. 2, Apr. 1993.

Deng, et al., "Exploring an Unknown Graph (Extended Abstract)", Proceedings of the 31st Annual IEEE Symposium on Foundations of Computer Science, pp. 355-362, 1990.

Diep, et al., "Systematic Validation of Pipeline Interlock for Superscalar Microarchitectures", Proceedings of the 25th Annual Symposium on Fault-Tolerant Computing, pp. 100-109, 1995.

Duncan, et al., "Using Attributed Grammars to test Designs and Implementations", Proceedings of the 5th International Conference on Software Engineering, pp. 170-178, 1981.

Dushina, et al., "Semi-Formal Test Generation with Genevieve", Proceedings of the IEEE/ACM 38th Design Automation Conference, pp. 617-622, 2001.

Frankl, et al., "Provable Improvements on Branch Testing", IEEE Transactions on Software Engineering, vol. 19, No. 10, Oct. 1993.

Gronau, et al., "A Methodology and Architecture for Automated Software Testing", Technical Report, IBM Research Laboratory in Haifa, Israel, 2000.

Hanford, K.V., "Automatic Generation of Test Cases", IBM Systems Journal, vol. 9, No. 4, pp. 242-257, 1970.

Harm, et al., "Testing Attribute Grammars", Proceedings of the 3rd Workshop on Attribute Grammars and their Applications (WAGA2000), pp. 79-98, Jul. 2000.

Hayes, et al., "Increased Software Reliability Through Input Validation Analysis and Testing", Proceedings of the 10th IEEE International Symposium on Software Reliability Engineering (ISSRE '99), pp. 199-209, Nov. 1999.

Homer, et al., "Independent Testing of Compiler Phases Using a Test Case Generator", Software-Practice and Experience, vol. 19, No. 1, p. 53-62, Jan. 1989.

Ho, et al., "Architecture Validation for Processors", Proceedings of the International Symposium on Computer Architecture, pp. 404-413, 1995.

Hopcroft, et al., Introduction to Automata Theory, Languages, and Computation, pp. 19-35, ISBN 0-201-02988-X, Addison-Wesley Publishing Company, Inc., 1979.

Horgan, et al., A Data Flow Coverage Testing Tool for "C", Proceedings of the Symposium on Assessment of Quality Software Development Tools, pp. 2-10, May 1992.

Iwashita, et al., "Behavioral Design and Test Assistance for Pipelined Processors", Proceedings of the IEEE 1st Asian Test Symposium, pp. 8-13, 1992.

Iwashita, et al., "Automatic Program Generator for Simulation-Based Processor Verification", Proceedings of the IEEE 3rd Asian Test Symposium, pp. 298-303, 1994.

Kantrowitz, et al., "Functional Verification of a Multiple-Issue, Pipelined, Superscalar Alpha Processor—the Alpha 21164 CPU Chip", Digital Technical Journal, vol. 7, No. 1, pp. 136-144, Jan. 1996.

Kantrowitz, et al., "I'm Done Simulating; Now What? Verification Coverage Analysis and Correctness Checking of the DECchip 21164 Alpha Microprocessor", Proceedings of the 33rd IEEE/ACM Design Automation Conference, pp. 325-330, 1996.

Klug, Hans-Peter, "Microprocessor Testing by Instruction Sequences Derived from Random Patterns", Proceedings of the International Test Conference, pp. 73-80, 1988.

Lee, et al., "Functional Test Generation for Pipelined Computer Implementations", Proceedings of the 21st Annual International Symposium on Fault-Tolerant Computering, pp. 60-67, 1991.

Lee, et al., "Conformance Testing of Protocols Specified as Communicating FSMs", Proceedings of IEE INFOCOM-93, pp. 115-127, Mar. 1993.

Lee, et al., "Principles and Methods of Testing Finite State Machines—A Survey", Proceedings of the IEEE, vol. 84, No. 8, Aug. 1996.

Lichtenstein, et al., "Model Based Test Generation for Processor Verification", Proceedings of the 6th Innovative Applications of Artificial Intelligence Conference (IAAI-94), pp. 83-94, Aug. 1994.

Logan, Carol A., "Directions in Multiprocessor Verification", Proceedings of the 14th Annual International Phoenix Conference on Computers and Communications, pp. 25-33, Jun. 1995.

Lin, et al., "Automatic Functional Test Program Generation for Microprocessors", Proceedings of the 25th IEEE/ACM Design Automation Conference, pp. 605-608, 1988.

Malloy, et al., "An Interpretation of Purdom's Algorithm for Automatic Generation of Test Cases", Proceedings of the 1st Annual International Conference on Computer and Information Science, pp. 310-317, Oct. 2001.

Maurer, Peter M., "Generating Test Data with Enhanced Context-Free Grammars", IEEE Software, vol. 7, No. 4, pp. 50-56, 1990.

Maurer, Peter M., "The Design and Implementation of a Grammar-based Data Generator", Software-Practice and Experience, vol. 22, No. 3, pp. 50-56, 1990.

Memon, et al., "Using a Goal-driver Approach to Generate Test Cases for GUIs", Proceedings of the 21st International Conference on Software Engineering, pp. 257-266, 1999.

Miller, et al., "On the Generation of Minimal-Length Conformance Tests for Communication Protocols", IEEE/ACM Transactions on Networking, vol. 1, No. 1, pp. 116-129, 1993.

Offutt, et al., "Generating Tests from UML Specifications", In Proceedings for the Second IEEE International Conference on the Unified Modeling Language (UML99), pp. 416-429, Springer, 1999.

O'Krafka, et al., "MTPG: A Portable Test Generator for Cache-Coherent Multiprocessors", Proceedings of the 14st Annual Phoenix Conference on Computers and Communications, pp. 38-44, Mar. 1995.

Raghavan, et al., "Multiprocessor System Verification through Behaviorial Modeling and Simulation", IEEE 14th Annual International Phoenix Conference on Computers and Communications, pp. 34-37, Jun. 1995.

Saha, et al., "A Simulation-Based Approach to Architectural Verification of Multiprocessor Systems", Proceedings of the 14th Annual International Phoenix Conference on Computers and Communications, pp. 34-37, Jun. 1995.

Shen, et al., "Protocol Conformance Testing Using Multiple UIO Sequences", IEEE Transaction on Communications, vol. 40, No. 8, Aug. 1992.

Sirer, et al., "Using Production Grammars in Software Testing", Proceedings of the 2nd Conference on Domain Specific Languages, pp. 1-13, Oct. 1999.

Su, et al., "Functional Testing Techniques for Digital LSI/VLSI Systems", Proceedings of the 21st IEEE/ACM Design Automation Conference, pp. 517-528, 1984.

Sun, et al., "On the Verification and Validation of Protocols with High Fault Coverage using UIO Sequences", Proceedings of the Symposium on Reliable Distributed Systems, pp. 196-203, 1992.

Talykhan, et al., "Microprocessors Functional Testing Techniques", IEEE Transactions on Computer-Aided Design, vol. 8, No. 3, pp. 316-318, Mar. 1989.

Thompson, Ken, "Regular Expression Search Algorithm", Communications of the ACM, vol. 11, No. 6, Jun. 1968.

Ural, et al., "A Test Sequence Selection Method for Protocol Testing", IEEE Transactions on Communications, vol. 39, No. 4, pp. 514-523, Apr. 1991.

Ural, Hasan, "Formal Methods for Test Sequence generation", Computer Communications, vol. 15, No. 5, pp. 311-325, Jun. 1992.

Wang, et al., "Axiomatic Test Sequence Generation for Extended Finite State Machines", Proceedings of 12th International Conference on Distributed Computing Systems, pp. 252-259, 1992.

Wang, et al., "Generating Test Cases for EFSM with Given Fault Models", Proceedings of IEEE INFOCOM-93, pp. 774-781, Mar. 1993.

Watanabe, et al., "A Specification-Based Adaptive Test Case Generation Strategy for Open Operating System Standards", Proceedings of the 18th International Conference on Software Engineering, pp. 81-89, 1996.

Wing, et al., "Testing and Verifying Concurrent Objects", Journal of Parallel and Distributed Computing, vol. 17, pp. 164-182, Academic Press, Inc. 1993.

* cited by examiner

FIG. 24

```
                // Get class definitions, operator overloads, etc.
1.      #include "ObjectClasses.h"
                // This function constructs a simple graph.
2.      ConstructGraph() {
                // S1, S2, and S3 are declared as symbols.
                // "symbols" are also referred to as "non-terminals".
3.          symbol(S1);   symbol(S2);   symbol(S3);
                // a, b, c, and d are declared as actions.
                // "actions" are also referred to as "terminals".
4.          action(a);   action(b);   action(c);   action(d);
                // e, f, and g are declared as actions.
5.          action(e);   action(f);   action(g);
                // S2 is c followed by e.
6.          S2 = c, e;
                // S3 is 1 to 3 repetitions of the sequence
                // of d and f.
7.          S3 = repeat(( (d, f), min(1), max(3) ));
                // S1 starts with a followed by an infinite
                // loop of b, either S2 or S3, then g.
8.          S1 = a, repeat(( b, (S2 | S3), g ));
                // Compile graph with S1 as start non-terminal into
                // a binary data file.
9.          CompileGraph(S1, "binarygraph.dat");
                // End of function.
10.     }
```

2402

FIG. 26
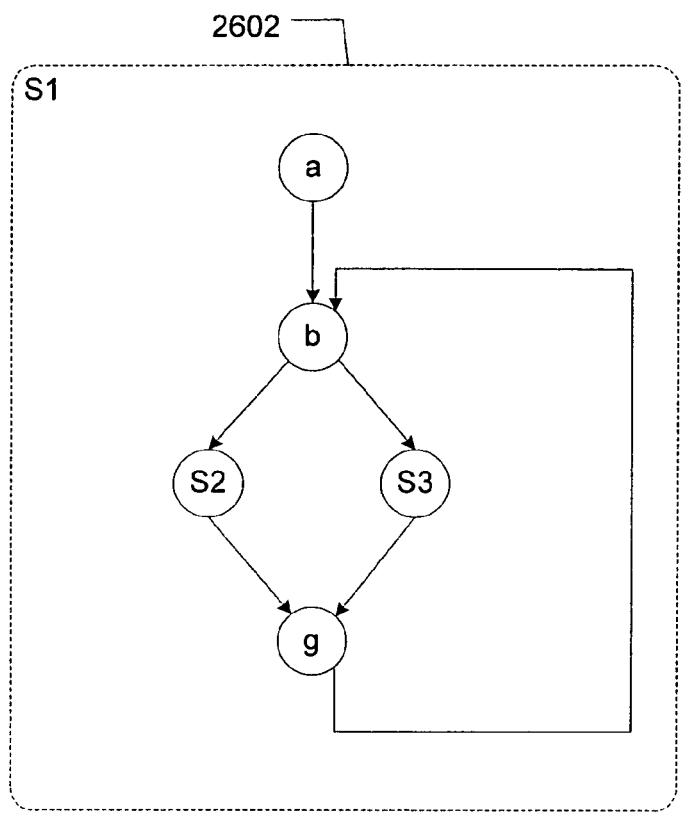
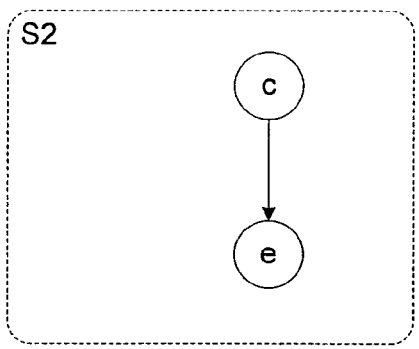
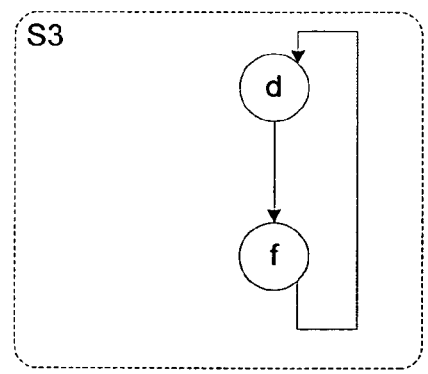

SYSTEM VERIFICATION USING ONE OR MORE AUTOMATA

RELATED APPLICATIONS

This application is a non-provisional application of provisional application No. 60/507,570, filed on Sep. 30, 2003, entitled "System Verification Method and Apparatus", and claims priority to said provisional application. The specification of said provisional application is also hereby fully incorporated by reference in its entirety, except for those sections, if any, that are inconsistent with this specification.

BACKGROUND OF THE INVENTION

1. Field of the Invention

This invention relates to the field of system verification. More specifically, the invention relates to the use of automata-based methods in the dynamic verification of a system or device under test.

2. Background

Definitions

"compliance assessment". (Defined in the text below.)

"compliance assessment protocol". (Defined in the text below.)

"compliance verification". Determination of the level of correspondence between the requirements expressed in a system specification and the performance of a DUT.

"deterministically specified system". (Defined in the text below.)

"directive". The communication of a request or command, and any other communication made for the purpose of causing the occurrence of an intended result. Those skilled in the art are familiar with a variety of ways of implementing directives, such as function calls.

"DUT", or "device under test". An implementation of a system that is to undergo verification.

"DUT computation". Computation of DUT behavior (e.g. simulation of a model of a DUT) during dynamic system verification.

"dynamic verification run". A single session of testing, that is, applying a compliance assessment protocol to a DUT.

"dynamic verification suite". The set of dynamic verification runs used in compliance verification.

"interface". Specified behavior made accessible by a system specification. This can include specialized behavior made available solely during verification. The totality of the behavior exhibited by a system is its interface, but, for convenience in explanation, it is sometimes useful to speak of different subsets or subparts of a system's interface as if they were separate.

"NDA", or "non-deterministic automaton". (Defined in the text below.)

"non-deterministically specified system". (Defined in the text below.)

"sequence". A series of verification operations and their associated timing information. Timing information may be in terms of suitably quantized periodic intervals or, equivalently, at arbitrary intervals dependent on the verification operations in question.

"system". A device or set of devices intended to accomplish a particular specified set of functions. A system could be implemented as software, hardware, or some combination of software and hardware. It is possible that the system exists in and of itself, as a model in some modeling environment, or as a combination of existence for some portion and model for others. The system has a defined interface through which it interacts with the outside world and the outside world interacts with it.

"test computation". Computation performed during dynamic system verification other than DUT computation.

"traverse". (Defined in the text below.)

"user". Person or persons involved in a compliance verification of a system.

"verification environment". The situation under which a dynamic verification run is conducted (e.g., temperature, humidity, clean room, noise, NC-Verilog™ hardware description language simulator, ModelSim™ hardware description language simulator). Together with the interface of the system, this establishes the set of verification operations that are possible to apply to the DUT as well as to the non-DUT components of the verification environment.

"verification operation". A verification action at an instant of time. The set of possible verification operations, which includes read and write, depends on a system's interface and a verification environment.

"verification protocol". (Defined in the text below.)

Overview

The creation of a system typically begins with the creation of a system specification (which may or may not be written down, in whole or in part) that defines the requirements for the system's functioning. These requirements may concern not only the desired function of the system but also other attributes such as power consumption, speed of operation, and so forth.

Verifying that a complex system operates in compliance with the requirements given in its system specification is difficult for many reasons. In particular, 1. The size of input that may be supplied to the system at any one time can be substantial. Even if the system has a relatively small number of individual input ports, the number of possible combinations of input values can still be very large. For example, having only 30 binary input lines still represents over a billion possible input combinations, and it is not uncommon for a system to have several times this number of inputs.

2. The system may keep an internal state. As a result, the functioning of the system at a particular time can be dependent not only on the inputs being supplied to the system at that time but also on all input that has been supplied to the system up to that time.

3. The combination of the two previous points results in an almost incomprehensibly large number of possibly unique situations arising in a given system. For example, a series of only 12 of the 30-bit inputs mentioned previously represents $2^{12 \cdot 30}$, or about $10^{108}$, potentially unique situations. Even if every particle in the universe were a verification system able to perform a verification test every nanosecond, there has not been enough time from the beginning of the universe to have tested all of the possible unique situations in this simple example.

4. Given the large number of unique situations arising from even limited series of inputs, exhaustive testing is not possible in the limited time and using the limited resources available today. Only a tiny fraction of the number of unique situations can actually be used for verification purposes. The quality of the compliance verification process is then highly dependent on how "good" the tests are that make up the sample from the total space of possible tests. (A "good" test is defined as one likely to detect a potential discrepancy between the DUT and its specification. A "good" set of tests is one that includes tests that do not significantly overlap in terms of which discrepancies they detect; that is, that they exhibit little-to-no redundancy.)

When searching for "good" tests or classes of tests, it is natural to attempt to control the complexity of the task by subdividing the total interface to the system into more manageable pieces and constructing tests for those pieces independently. While this kind of "divide and conquer" approach is useful in many other areas, it is not appropriate in the compliance verification of complex systems. In particular, the following difficulties are encountered.
1. Complex systems in general comprise a number of subparts which may interact internally, either directly (through, e.g., active collaboration on the accomplishment of some task) or indirectly (through, e.g., the successive use of the same shared resources). These subparts may exhibit behavior through the system's interface and these behaviors may be in active use simultaneously.
2. Another layer of complexity is therefore added by the interaction of the activity of one of these subparts with the activity of the others. In particular, not only is the behavior of a subpart dependent on the entire history of its input stream, it is also dependent on the relative timing of its activity with that of other subparts of the system who are themselves dependent on the entire histories of their own input streams.
3. As a result, it is not possible in general to separate the verification of one part of a system's interface from that of the other parts, even when the parts do not, from a user's point of view, have any relation to each other. As a particular example, presenting the same input to one part of the system's interface at different times can result in different responses, depending upon what else just happened to be occurring elsewhere in the system at that moment.
4. Defects may therefore be obscured until not only the appropriate stimulus on the pertinent part of the interface is applied, but also until that stimulus is coordinated with the complete stimulus history applied to other parts of the interface as well. More intricate and subtle tests have to be created to exercise these situations.

To users, the behavior of systems can appear to be either deterministic or non-deterministic. Behavior appears to be deterministic to a user of a system if the specification provided to said user has sufficient information to enable the computation of the precise response pattern of the system for any sequence of stimulus that is included in the system's specification. We call a specification that makes a system appear to be deterministic a "deterministic specification". Behavior appears to be non-deterministic to a user of a system if the specification provided to said user does not have sufficient information to enable the computation of the precise response pattern of the system for a sequence of stimulus that is included in the system's specification. We call a specification that makes a system appear to be non-deterministic a "non-deterministic specification".

While at first glance it may appear that a deterministic specification is more desirable, a system may have a non-deterministic specification for a variety of reasons.

The system may be implemented in such way that it is inherently non-deterministic (e.g., dependent on quantum decay events).

The system may have a deterministic but very complex implementation, which would be difficult for users to understand or work with. A non-deterministic specification can be considerably more concise, as well as easier to understand and work with.

The system may have a deterministic but proprietary implementation, which the system provider does not want to reveal.

The system may be a deterministic implementation of a specification that was deliberately written as a non-deterministic specification to allow a wide range of implementations. Industry-standard interface specifications are often written as non-deterministic specifications for this reason.

We will refer to a system that has a non-deterministic specification as a "non-deterministically specified system", or an "NDS system". We will refer to a system that has a deterministic specification as a "deterministically specified system", or a "DS system".

A large portion of modern systems are NDS systems; for example, microprocessors, multi-threaded software systems (e.g., Windows, Linux), automotive control systems, avionic control systems, and so forth. An NDS system may expose subsystems which are DS systems for, e.g., specialized applications.

The manual selection of "good" tests or "good" classes of tests from the space of all possible tests is difficult for many reasons. In particular,
1. As has been described, the space of possible tests is so immense that only a tiny fraction of tests can ever be selected. As is well-known by statisticians, selecting an appropriate sample under such conditions is quite difficult. It is also difficult to define what "statistically appropriate" means when applied to compliance verification. Consequently, much of the prior art mathematical analysis that has been created for other domains may not be applicable.
2. Given the large number of dimensions along which the space can vary, it is difficult for humans to conceptualize the entire extent of possible tests. Without such conceptualization, however, it is not possible to create an efficient and spanning test strategy.
3. In response, ad hoc and intuitive approaches have been used. These methods can be somewhat successful in achieving limited levels of compliance assessment, but in general they do not provide adequate coverage across the entire space of possibilities. The tests that are produced under such strategies tend to be concentrated in those areas that "seem to need" testing, according to preconceived notions. Other areas might remain entirely uncovered.
4. The conceptualization difficulty extends to those situations that require extended setup. The intricate nature and length of the sequence necessary to establish the conditions for a particular defect to manifest itself in an observable fashion can be beyond the ability of a user to visualize even though, because of the high speed of the components, such conditions may occur within the normal functioning of the system at frequent intervals.
5. The conceptualization difficulty further extends to those situations that require interaction complexity. Systems can achieve performance advantages by reusing internal resources and performing functions in parallel. Such techniques result in complex internal interactions, not readily apparent to the user, even when all details of the implementation are known. This internal interaction complexity can also be beyond the ability of the user to visualize, especially when taken in conjunction with the extended-setup difficulty previously described.

Once a problem has been detected, it is necessary to track back to the original root cause. This root cause may have occurred much earlier during the execution of a test than the point at which an anomaly was first observed, and the anomaly may be observed in a part of the system far removed from where the defect actually is located. One way to do this analysis is to re-run the same sequence that exposed the defect, but with additional checking enabled to observe aspects of the DUT that were previously ignored. A difficulty with this approach is that numerous re-runs may be required. Another difficulty is that the set-up required to get the DUT into the state in which the root cause may occur could be quite time-consuming to execute. These two factors can compound each other.

Another approach entirely is for the user to contrive a hypothesis as to the cause of the observed defect and then construct a "small" test program that exercises just those circumstances. The construction of such a test program can be quite complex because, among other reasons, it is not always easy to identify the least amount of set-up required to get the DUT into the state that detection of the root cause requires. It is of great value to have a testing method that supports the rapid development of a sequence or set of sequences that exhibit particular properties.

Verification of a system's compliance with its specification may be performed at various stages in the system's development, either by using a model of the system at some abstraction level or by using a fabricated example of the system. Performing compliance verification by using a model before actual system fabrication can be very advantageous because of the great savings in time, money, and resources that may be gained.

For purposes of explanation only, the following discussion will focus on compliance verification by using system models as opposed to actual system implementations.

Within the context of compliance verification using a system model, the verification environment may be more precisely defined as encompassing among other items a representation of the system model (also known as the target or DUT, device under test) and a mechanism for processing the system model (typically a simulator or a model interface, which in some cases may be built into the system model itself). Within this environment, the number of possible individual verification operations (appropriate or not) that may be performed on the DUT at any one time can be very large. The number of different sequences of verification operations that may be performed on the DUT increases exponentially as a function of the complexity of the system and the lengths of the sequences. Whenever we refer to reading from or writing to the DUT, we also mean reading from or writing to any part of the verification environment, including the mechanism for processing the system model as well as any other objects.

Out of the universe of all possible sequences, the user defines the subset for which the specification defines a behavior that will result when the sequence is applied to the DUT. We call such sequences "meaningful". The meaningful sequences can include both those that are anticipated during normal operation of the DUT and those that indicate errors. It is useful to include both types of sequences because the user may desire to ascertain not only that the DUT operates according to its specification when presented with normal inputs but also when presented with error inputs.

The definition of this subset is itself typically extremely difficult due to among other factors the non-deterministically specified behavior of the DUT that constrains what is and isn't meaningful and the need to ensure that only meaningful sequences are included.

This subset of sequences is known as the verification protocol.

Typically, testing the DUT merely by applying the verification protocol to it is not sufficient to achieve effective and efficient compliance verification. Usually additional compliance assessment computation is done during testing, typically to check that DUT behavior meets requirements. In general, compliance assessment can be described without loss of generality as a sequence of steps each of which occurs between the relevant steps of the verification protocol. Each compliance assessment step takes as its input the current state of the compliance assessment and the current observable state of the DUT, and computes a new state of the compliance assessment, or reports information to the user, or some combination of both. The combination of the verification protocol and compliance assessment will be referred to hereinafter as the compliance assessment protocol. The process of testing a DUT by applying a compliance assessment protocol to said DUT is called dynamic verification.

To meet specific compliance verification goals the user identifies which sequence(s) from the compliance assessment protocol will be made use of in any one dynamic verification run. Such goals may include the exercise of certain portion(s) of the DUT, the exercise of certain subset(s) of the system specification, completion of the dynamic verification suite within a time limit, the ability to execute the dynamic verification suite using a particular set of resources, and so forth. The user may decide to perform a given dynamic verification run repeatedly to investigate a problem. As some sequences may be infinite in length, the user may decide to make use of only a portion of a sequence. The user may also decide to make use of a sequence repeatedly.

Along with sequence selection, the user also determines when a sufficient amount of verification has been conducted to declare the DUT as in compliance with its specification, and the conditions under which the DUT will be declared as not in compliance with its specification.

A representation of the compliance assessment protocol and a mechanism for applying the compliance assessment protocol to the system model and interpreting the results are included as part of the verification environment mentioned above.

Aside from the great difficulties just described, the user often has the additional difficulties of having to create the compliance assessment protocol while the specification of the system is not in its complete, finished form. Changes to the specification may be made at any time during system verification, and such changes must be reflected by appropriate changes in the compliance assessment protocol.

Another significant issue arises from the fact that many "new" systems designs that need to be verified are not totally new, but are instead improved versions of existing system designs that have already been verified. Because creation of a compliance assessment protocol for a complex system is quite difficult, expensive, and time-consuming, it is important from both a cost perspective and time-to-market perspective that a compliance assessment protocol for a system be created in such a way that as much of it as possible can readily be reused on future or similar systems.

In the prior art, various methods have been used for expressing the compliance assessment protocol, identifying the sequence(s) or portion(s) of sequence(s) that are used in a particular dynamic verification run, maintaining and updating the specification of the compliance assessment protocol, and providing at least some measure of verification work reuse.

In general the prior art approaches may be divided into those that are purely programmatic in nature and those that use automata. The automata approaches in general include some measure of programmatic techniques to carry out imperative functions. Each of these kinds of approach is considered below.

The most common of the early programmatic approaches to verification is known as "directed testing". Typically a directed test program implements and tests a single sequence from the compliance assessment protocol. The user manually codes the test program in some imperative programming language(s) supported by the verification environment. This test program generates some stimulus to be applied to the DUT, observes the DUT's response or reaction, and then repeats the process.

The sequence from the compliance assessment protocol implemented by a particular directed test program is chosen through the user's manual selection of the particular pattern of stimulus to generate for application to the DUT. It is the user's responsibility to ensure that the DUT is in the proper state to accept the stimulus (if any), to observe the DUT's response or reaction (if any), and to check that said response or reaction is appropriate for the applied stimulus. All of these actions must be manually coded by the user.

The cost of creating a directed test for each of the large number of sequences that are needed to test a typical modern design is generally prohibitive. Fortunately there are a number of similarities within various subsets of the desired tests, so some program code can be shared between some of the directed tests. It is a natural progression from this observation to the creation of a parameterized or configurable test program that encompasses multiple directed tests. These configurable test programs can decide which of a range of tests to perform, how to vary the internal parameters that affect the tests, and so on. Such a test program accepts as part of its input from the user an indication of which aspects of its range of testing it is to carry out during any particular dynamic verification run, acceptable value sets for various parameters and the like, and so forth.

The combination of a set of directed tests into a configurable test program is entirely manual. The user must conceive of a set of possible tests, select the subset of these tests that will effectively make use of the available verification resources by minimizing redundancy, identify the dimensions along which the selected tests may be factored, perform the factoring, and blend the fragments into the configurable test program. This work requires a higher degree of skill than the creation of individual directed test programs, for the user must not only be able to comprehend what the individual directed test programs would be like if written (so the appropriate fragments for factoring can be identified) and conceive of how the fragments may be called in sequence so the DUT progresses through the appropriate series of states, but also be able to construct a suitable mechanism for doing so.

The configurable test program contains not only the union of all of the functionality of the individual directed test programs it replaces, but also extra code to implement the configurability itself. This extra code adds knowledge of a different sort than that contained in an individual directed test program. Instead of being directed towards the generation of stimulus, the acquisition of response or reaction information, or the checking thereof, the added material relates to the higher-order pattern of exercising the DUT. There has been a mixing of knowledge about what should be verified (i.e., which of the possible tests should be applied) with how (i.e., application of stimulus, checking of response). This mixing results in a significantly more complex test program and correspondingly increases the cost in time and effort to create the test program and to ensure that it is correct.

At the cost of a substantial increase in complexity and programming skill requirements, configurable test programs provided significantly more unique test sequences than could be created using individual directed tests. However, as design complexity increased, more powerful techniques were needed to expand the number of tests. The most popular recent technique is constrained pseudo-random testing (CPRT). In this approach, a number of pseudo-random choices are incorporated into a configurable test program which extend the range of possible sequences that the program can generate. In general some of these sequences are in the compliance assessment protocol and some are not. Therefore a CPRT program typically also contains a number of constraints on the pseudo-random choices which operationally restrict the choices so that the resulting sequences are all in the compliance assessment protocol.

The CPRT approach does expand the number of tests that a configurable test program can create, but at a substantial cost in terms of simulation efficiency. To completely cover a given set of sequences typically takes considerably more simulation cycles with a CPRT program. The amount of simulation time wasted increases rapidly as the size of the target sequence set grows, typically at the rate of $(N*\ln(N)-N)$, where N is the size of the target sequence set. Even for a relatively small N of twenty three thousand, on average it takes ten times as long to cover a sequence set with CPRT. For the substantially larger sequence sets that are typically needed to test complex modern designs, the cost of this can be prohibitive.

In the prior art, an alternative to the use of a programmatic approach to system verification is the use of an automata-based approach.

Non-deterministic automata can be described in a variety of ways. For example, some prior art teachings describe non-deterministic automata in terms of states and transitions, some prior art teachings describe non-deterministic automata in terms of grammars or sets of strings of terminals, and some prior art teachings describe non-deterministic automata in terms of graphs, i.e., nodes and connections. All such prior art non-deterministic automata descriptions are mathematically equivalent, and can be transformed into each other using techniques well-known to those skilled in the art.

Prior art teachings show how to apply non-deterministic automata to the problem of system verification by using them to define sequences of test program fragments (also known as "action routines") that can be executed one after another during a dynamic verification run. For example, some prior art teachings use non-deterministic automata described in terms of a combination of states and transitions with references to test program fragments from the states, from the transitions, or from a combination of both. For example, some other prior art teachings use non-deterministic automata described in terms of a combination of grammars or sets of strings of terminals with references to test program fragments from the terminals, from the non-terminals (if any are defined in the grammars), or from a combination of both. For example, some other prior art teachings use non-deterministic automata described in terms of a combination of graphs (i.e., nodes and connections) with references to test program fragments from the nodes, from the connections, or from a combination of both. The prior art implements references to test program fragments in a variety of ways, such as pointers, lookup table entries, etc. All such prior art combination descriptions (including in said combination descriptions the references to test program fragments and the referred-to test program fragments themselves) are mathematically equivalent, and can be transformed into each other using techniques well-known to those skilled in the art. Some prior art teachings refer to the entities described by the combination descriptions as "extended non-deterministic automata", regarding the test program fragments as "automata extensions". Other prior art teachings simply refer to the entities described by the combination descriptions as "non-deterministic automata", regarding the test program fragments to be part of the automata. For the sake of clarity and brevity, we will take the latter approach and use the phrase "non-deterministic automata" to refer to the entities described by the combination descriptions. The singular form of "non-deterministic automata" is "non-deterministic automaton". For brevity, we will sometimes use the abbreviation "NDA" to refer to a non-deterministic automaton. Mathematically, the set of non-deterministic automata without test program fragments is a proper subset of the set of non-deterministic automata with some non-negative number of test program fragments, since the number can be zero.

Since non-deterministic automata can be described in a number of mathematically equivalent ways, for the sake of brevity we will select any one of the description methods whenever we make a point about them—the application of the point to non-deterministic automata described using any of the other methods should be readily appreciated by those skilled in the art. Also, prior art teaches that deterministic automata are a proper subset of the set of non-deterministic automata, and so are included whenever non-deterministic automata are discussed.

The automaton approach to testing was developed in the prior art by those verifying a DS system or a deterministic subset of an NDS system. Primarily, the domain area was single-threaded software applications. Typically in this prior art, the automaton is used to help track the states of the software application under test.

In many prior art automata applications, a graph representing the NDA's grammar (an "NDA graph") is constructed, often by means of a program that takes as input an extended-BNF-like description and creates an NDA graph automatically. The graph is traversed to generate a terminal sequence. This terminal sequence is used in effect to stitch together in sequential order the test program fragments corresponding to the terminals to compose a specific application of the compliance assessment protocol for a dynamic verification run.

In the prior art, traversing is done in a variety of ways. "Traverse" includes any method of processing an NDA in which a plurality of components of the NDA are processed in a sequence which is defined in the specification of the NDA.

By using the automaton method, the specification of an entire universe of test programs can be constructed using a relatively modest number of test program fragments that carry out particular fundamental operations. The generation of any individual test from the specified universe can be carried out by a generic test generation program that takes a non-deterministic automaton representing a compliance assessment protocol as its input and performs a traversal of the corresponding NDA graph according to some particular traversal strategy. The application of the generated test can be carried out by a generic test application program that executes the corresponding test programs fragments in the sequential order determined by the traversal. Typically changes to the specification of the universe of test programs do not require changing the test generation program or the test application program (which may in some cases be combined into a single program).

In general, the prior art automaton approaches have several advantages over the strictly programmatic approach. The advantages are analogous to those obtained in complier development by moving from the hand-crafted creation of a, for example, recursive-descent parser to one created from a grammar-based language specification by an automatic parser generator (for example, yacc or Bison).

One advantage of the prior art automaton approaches is that they separate the specification of the compliance assessment protocol (expressed by a non-deterministic automaton) from the selection of the particular sequence(s) used in a given dynamic verification run (expressed by how the non-deterministic automaton is processed or traversed). As a result, different persons can work on either portion of the problem, improving the development, communication, review, and management aspects of the process of test program creation. Further, the scope of the compliance assessment protocol can be easily seen without the clutter of the details contained in the test program fragments. Another significant advantage is that the automaton's grammar itself can be related directly to a system's specification without having to factor out the traversal code. This provides the foundation for a more meaningful measurement of the coverage achieved by a particular dynamic verification run.

In contrast, the programmatic approach defines the compliance assessment protocol operationally, that is, by the particular code that makes up the test program. In general, there is no distinction drawn in the test program between (a) the code that generates and applies the stimulus, acquires the response or reaction of the DUT, and checks the result for appropriateness, and (b) the code that makes the actual selection of which stimulus sequence to apply. By mixing the two, it becomes much more difficult if not impossible to independently process the two kinds of knowledge. It is especially difficult for the traversal strategy since in the programmatic approach that strategy is typically implicit in how the test program was coded. The user's intent is unavoidably obscured and the strategy cannot be easily understood or modified automatically to achieve a different objective than was intended when it was originally written, for example, additional coverage objectives. The coverage that can be measured is less useful because it focuses on lines or paths of the test program's code rather than the requirements given in the system's specification. Further, since the sequence selection is manual, all of the difficulties associated with the manual selection of "good" test cases (discussed above) are encountered.

Another advantage of automaton-based approaches is that they result in more concise specifications of the compliance assessment protocol for a given level of coverage of the specification. As a result, less time is typically required for their creation, and they are easier to change, maintain, update, extend and reuse. Because of these factors, they are also likely to have fewer bugs. The total amount (and complexity) of code that the user must manually create in the programmatic approach puts severe limits on the amount of coverage a user can achieve in a given amount of time.

The advantages of automaton-based approaches over programmatic approaches are a function of the degree to which the extent of the verification protocol is expressed in the automaton's grammar instead of in the test program fragments. For a given compliance assessment protocol, the more the extent of the verification protocol is expressed in the grammar, the more the advantages of the automaton-based approach can be realized. In contrast, the more the extent of the verification protocol is expressed in the test program fragments, the closer it comes to the programmatic approach with all of the disadvantages described above.

The prior art automaton approaches have primarily been applied to testing systems, such as single-threaded software programs, in which non-deterministically specified behaviors are either non-existent or highly localized. In such verification applications, most of the extent of the verification protocol can readily be expressed in the automaton's grammar without any need for the ability to dynamically constrain the series of terminal generation (equivalent to dynamically constraining the traversal of an NDA graph) during a dynamic verification run. However, when prior art approaches are applied to more complex systems, such as multi-threaded microprocessor based computer chips, in which non-deterministically specified behaviors are not highly localized, the user is forced to shift much of the expression of the verification protocol's extent from the automaton's grammar into the test program fragments. As a result, the test program fragments become substantially larger and more complex, and much of the advantage of using an automaton-based approach instead of a programmatic approach is lost.

We can see, therefore, that prior art automaton approaches have several advantages over programmatic approaches, but also rather severe limitations on the degree to which the extent of the verification protocol can be represented in the automaton's grammar. These limitations have prevented the automaton approach to verification from being used in the compliance verification of many complex systems.

A problem with the programmatic approach is that a substantial amount of time and expense is required for test conceptualization, development, update, and maintenance. These costs are often significantly greater than those incurred for the creation of the design of the system itself. Test conceptualization is especially difficult using the programmatic approach because of the test selection problem described previously. The test programs developed using this approach are large pieces of software. All of the well-known difficulties of development, update, and maintenance of large, complex software applications must therefore be surmounted.

A problem with the programmatic approach is that the reduction of observed anomalies to root causes or defects is very costly in time and resources. To decrease the amount of time required to recreate the situation that exhibits an anomaly, the user typically attempts to minimize the set-up sequence. However, determining how to do this appropriately and, especially, correctly editing the test program to achieve it under the programmatic approach is very costly because of the aforementioned difficulties of working with large pieces of complex software.

A problem with the programmatic approach is that test creation early in the product development process is very costly in time and resources. Since a large test program is typically required for verification, it is advantageous to begin its construction as soon as possible. However, early in the product development process it is quite normal for the system specification to change frequently. Correctly identifying and revising the test program code affected by these changes is very costly because of the aforementioned difficulties of working with large pieces of software.

A problem with the programmatic approach is that it requires relatively high levels of software development skill from the developers of tests because of the aforementioned difficulties of working with large pieces of complex software.

A problem with the programmatic approach is that substantial numbers of defects are typically found in the test program while it is being used to verify the target system. It has been observed in the prior art that the number of defects found in the test software is typically at least as large as the number found in the target system itself. Investigating and fixing these defects consume large amounts of time and resources. This is a natural consequence of the fact that the programmatic method requires the creation of substantial amounts of complex software to implement the tests. As is well-known to those skilled in the art, the incidence of defects in complex software is strongly correlated to the number of lines of code written.

A first level of measure of the value of a new test sequence when added to a set of existing test sequences is whether or not it is the same as any of the sequences already in the set, i.e., does it exercise anything different. A test sequence that is not different in at least some aspect is typically not worth adding to the set. A next level of measure of value is how different the new test sequence is, i.e., how many different aspects of the system's specification are covered. From this concept, we can then consider the breadth of coverage of a given set of test sequences as its span. Given that it is not possible typically to exercise every possible aspect of a system's behavior, it is valuable to spread the verification effort across as much of the system specification space as possible by creating a set of unique test sequences with as large a span as possible. However, because of the test selection problem described previously, this is very difficult when using the programmatic approach.

As with any other large software project, the creators of programmatic approach tests have certain goals when writing test programs: getting the programs done, avoiding defects, making the execution fast, and so forth. These goals are not the same as those when the users have to communicate with the various verification process stakeholders (customers, designers, colleagues, management, etc.). At those times, it's more important for the users to communicate an understanding of the complex body of work represented by the tests. In these cases, hierarchy, abstraction, progressive disclosure of detail, and so forth, are required. These two sets of goals are typically not compatible for large, complex software projects. In the programmatic method, the same difficulties are encountered.

A serious problem with prior art automaton-based methods is their inability to dynamically change the traversal of the automaton or the automaton itself to handle various non-deterministically specified behaviors as they are exhibited by the DUT during verification. For many complex systems, this problem severely limits the degree to which the extent of the verification protocol can be represented in the automaton's grammar. This has prevented prior art automaton approaches to verification from being used in the compliance verification of many complex systems.

BRIEF DESCRIPTION OF THE DRAWINGS

FIG. 24 shows an example graph construction routine.

FIG. 26 shows a graph resulting from the graph construction routine shown in FIG. 24 and simplifying transforms.

DETAILED DESCRIPTION OF EMBODIMENTS

Figure 1:
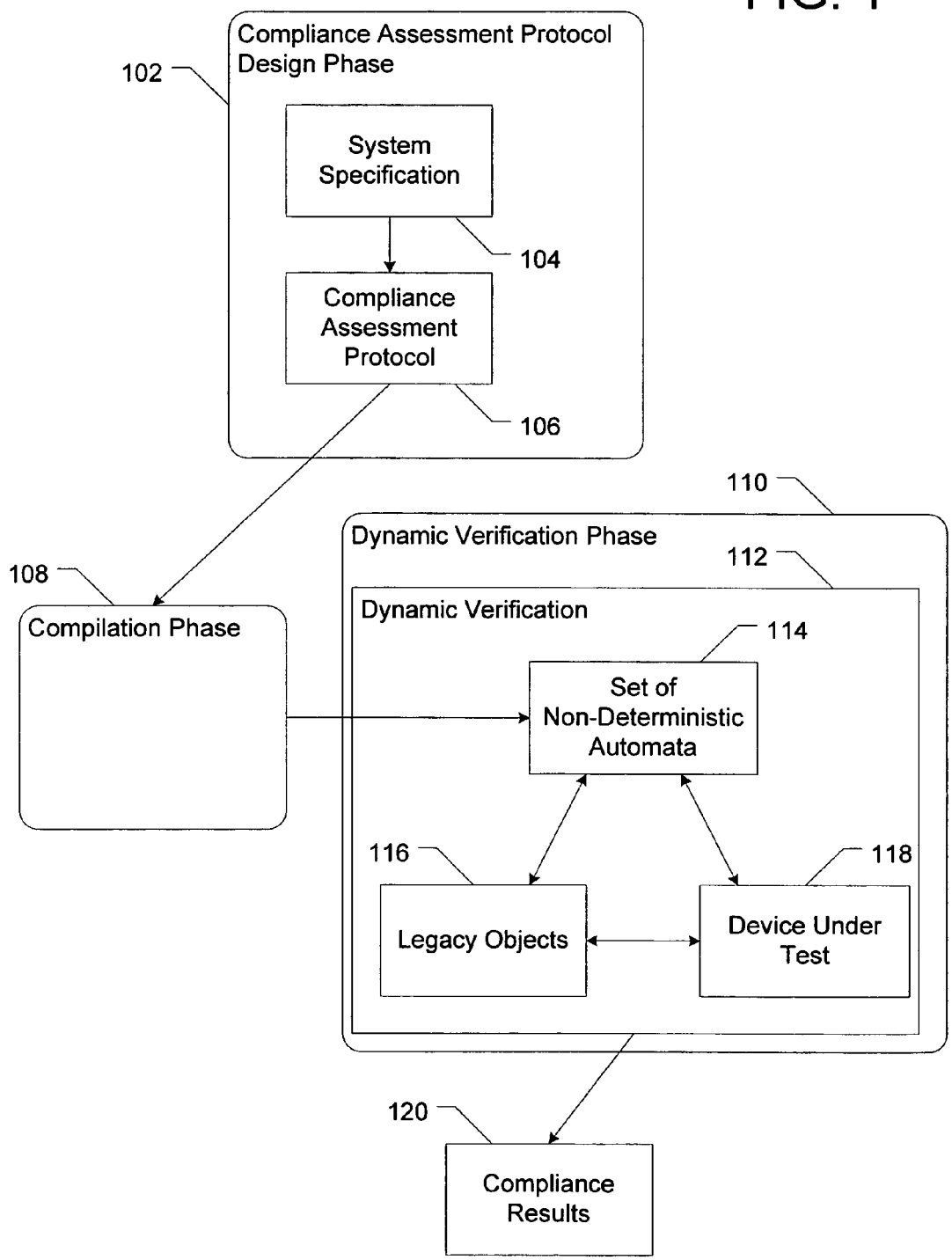
FIG. 1 shows an Overview.

In the following description, various aspects of one or more embodiments of the present invention will be described. However, it will be apparent that other embodiments of the present invention may be practiced with only some or all described aspects. For purposes of explanation, specific numbers, materials, and configurations are set forth in order to provide a thorough understanding of the present invention. However, it will also be apparent that other embodiments of the present invention may be practiced without the specific details. In other instances, well-known features are omitted or simplified in order not to obscure the present invention.

Parts of the description will be presented in terms of operations performed by a digital system, using terms such as data, tables, prompting, determining, and the like, consistent with the manner commonly employed by those skilled in the art to convey the substance of their work to others skilled in the art. As is well understood by those skilled in the art, these quantities can take the form of electrical, magnetic, or optical signals capable of being stored, transferred, combined, and otherwise manipulated through mechanical, electrical, and optical components of the digital system. The term digital system includes general purpose as well as special purpose data processing machines, systems, and the like, that are standalone, adjunct, or embedded.

Various operations will be described as multiple discrete operations in turn, in a manner that is most helpful in understanding the present invention, however, the order of description should not be construed as to imply that these operations are necessarily order dependent. In particular, these operations need not be performed in the order of presentation, and selected ones of these operations may also be performed in parallel.

Some DUTs, e.g. executable behavioral models written in the 'C' programming language, can be used directly in a dynamic verification run. Other DUTs, such as hardware models written in the Verilog language, are used in a dynamic verification run through a simulator which computes their behavior. Still other DUTs, such as physical devices, are used in a dynamic verification run through a software interface. As is common in descriptions in the art, in the description below the use of a simulator or a DUT software interface where needed is often implied rather than stated. For example, the phrase "sending stimulus to the DUT", in the case of an executable behavioral model means sending stimulus directly to the DUT, but in the case of a Verilog DUT means sending stimulus to a simulator which is computing the behavior of the DUT, and in the case of a physical device DUT means sending stimulus to the DUT software interface.

Further, the description repeatedly uses the phrase "a subject embodiment". Each time the phrase is used, it refers to any one of the embodiments in some set of embodiments including Tesla 1.2.4. Successive uses of the phrase "a subject embodiment" may or may not involve the same set of embodiments, but every such set includes Tesla 1.2.4.

Overview

An overview of a subject embodiment is illustrated in FIG. 1.

A subject embodiment comprises a method and apparatus that enables a user to specify a compliance assessment protocol 106 (e.g. during a compliance assessment protocol design phase 102) by specifying a set of non-deterministic automata ("NDA set") 114 consisting of one non-deterministic automaton (2104 of FIG. 21) or a plurality of non-deterministic automata. Each NDA 2104 may comprise specifications for one or more action routines (2110 of FIG. 21), such as test program fragments, that are associated with terminals in the NDA's grammar. In a subject embodiment, the action routines can specify any desired series of actions, such as inputs to the DUT 118 and/or to legacy objects 116 (such as external memory models) in the verification environment used for dynamic verification 112, checks of the observable state of the DUT and/or legacy objects, compliance assessment computations to produce compliance results 120, etc. To facilitate specification of an NDA 2104 in a subject embodiment, the user may use non-terminals (referred to in some embodiments as "symbols") to represent specified sequences of terminals and non-terminals in said NDA, thereby enabling the user to specify said NDA hierarchically. To further facilitate specification of said NDA in a subject embodiment, the user may also use "alternative expressions" in any sequence to specify sets of alternative sequences of terminals and non-terminals, which will cause a subject embodiment's NDA traversal mechanism (2114 of FIG. 21) to select and traverse (during dynamic verification 112) one alternative member sequence of a set each time its alternative expression is reached. The user may assign weights to any of the alternatives in alternative expressions, and these weights will influence the probability with which the alternatives are selected when their alternative expressions are reached during NDA traversal (1002 of FIG. 10). In particular, a weight of zero will make the probability of selection zero, which removes the alternative from said NDA for the purposes of relevant traversals.

A subject embodiment includes an NDA traversal mechanism 2114 for traversing each NDA 2104 during a dynamic verification run (2100 in FIG. 21) (i.e. a session of dynamic verification 112) in a dynamic verification phase 110, thereby selecting one of its terminal sequences for use. Typically, each time a terminal is reached during NDA traversal 1002, the actions in the corresponding action routine 2110 are executed. The sequence of action routine executions as the NDA set is traversed implements one of the tests in the compliance assessment protocol 106.

Figure 21:
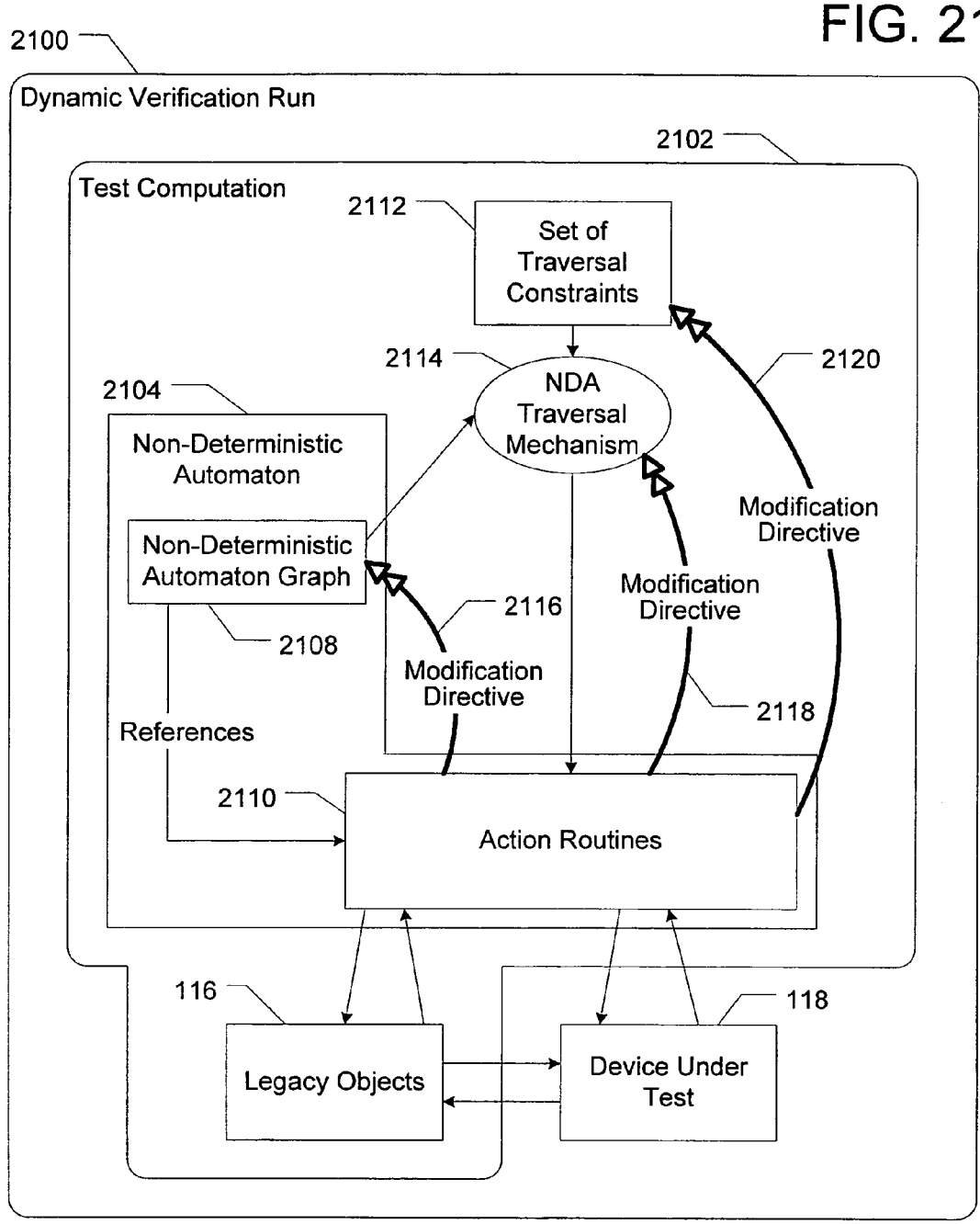
FIG. 21 shows Automata Manipulation and Traversal Manipulation during Traversal.

A subject embodiment also includes mechanisms for manipulating an NDA 2104 and its NDA traversal 1002 during traversal within a test computation 2102, as illustrated in FIG. 21.

A subject embodiment includes mechanisms to modify an NDA 2104 from action routines 2110 during (i.e. after the beginning of and before the end of) an NDA traversal 1002 of said NDA. One of said mechanisms enables the action routines to issue NDA graph modification directives 2116 to change the weights of alternatives in alternative expressions. In this way, alternatives can be removed from the NDA for relevant traversals by changing their weights from a positive value to zero, or added to the NDA by changing their weights from zero to a positive value. Another of said mechanisms enables the action routines to issue NDA graph modification directives 2116 to change which action routines 2110 are pointed to by terminal objects. The issuance of NDA graph modification directives 2116 may be based on any desired computation. Said computations can include any computation based on any aspect of the observable state history of the DUT 118, thereby enabling the user to specify that the NDA modify itself during a dynamic verification run 2100 in response to the behavior of the DUT, whether or not said behavior is non-deterministically specified.

A subject embodiment includes mechanisms to modify an NDA traversal 1002 of an NDA 2104 by modifying the corresponding NDA traversal mechanism 2114 from action routines 2110 during (i.e. after the beginning of and before the end of) said NDA traversal 1002 of said NDA. Said mechanisms enable the action routines to issue NDA traversal mechanism modification directives 2118 to change the traversal strategy (see below for a discussion of traversal strategies) currently being used by the NDA traversal mechanism 2114. For example, the traversal strategy could be changed from the pseudo-random traversal strategy to the skip traversal strategy. The issuance of NDA traversal mechanism modification directives 2118 may be based on any desired computation. Said computations can include any computation based on any aspect of the observable state history of the DUT 118, thereby enabling the user to specify that an NDA traversal mechanism 2114 be modified during a dynamic verification run 2100 in response to the behavior of the DUT, whether or not said behavior is non-deterministically specified.

A subject embodiment includes mechanisms to modify a set of traversal constraints 2112 on an NDA traversal mechanism 2114 for an NDA traversal 1002 of an NDA 2104 from action routines 2110 during (i.e. after the beginning of and before the end of) said traversal. Said mechanisms enable the action routines to issue "set of traversal constraints" modification directives 2120. For example, an action routine can issue a directive changing the set of traversal constraints 2112 by adding a constraint that requires the NDA traversal mechanism 2114 to traverse a specified terminal before traversing any other terminals. This can be used to react to the dynamic behavior of the DUT by limiting the traversal of the terminal sequences defined in the NDA graph 2108 to those which are consistent with the compliance assessment protocol at that time. The issuance of "set of traversal constraints" modification directives 2120 may be based on any desired computation. Said computations can include any computation based on any aspect of the observable state history of the DUT 118, thereby enabling the user to specify that a set of traversal constraints 2112 be modified during a dynamic verification run 2100 in response to the behavior of the DUT, whether or not said behavior is non-deterministically specified.

A subject embodiment includes resource management mechanisms to ensure that an NDA 2104 has exclusive use of any resource for any computation for which it needs such exclusive use in order to correctly adhere to the compliance assessment protocol. A resource can represent anything, but is typically used for things that may be in limited supply during a dynamic verification run 2100, such as computer memory, bandwidth, etc. In some applications, resources are purely conceptual; such resources can be used to enforce sequencing requirements or concurrency limitations among computations performed by various members of a set of automata. Typically each resource has a set of properties. A property can be any attribute of a resource, such as its address range, its ability to read data, etc. Like resources, properties can also be purely conceptual.

Figure 22:
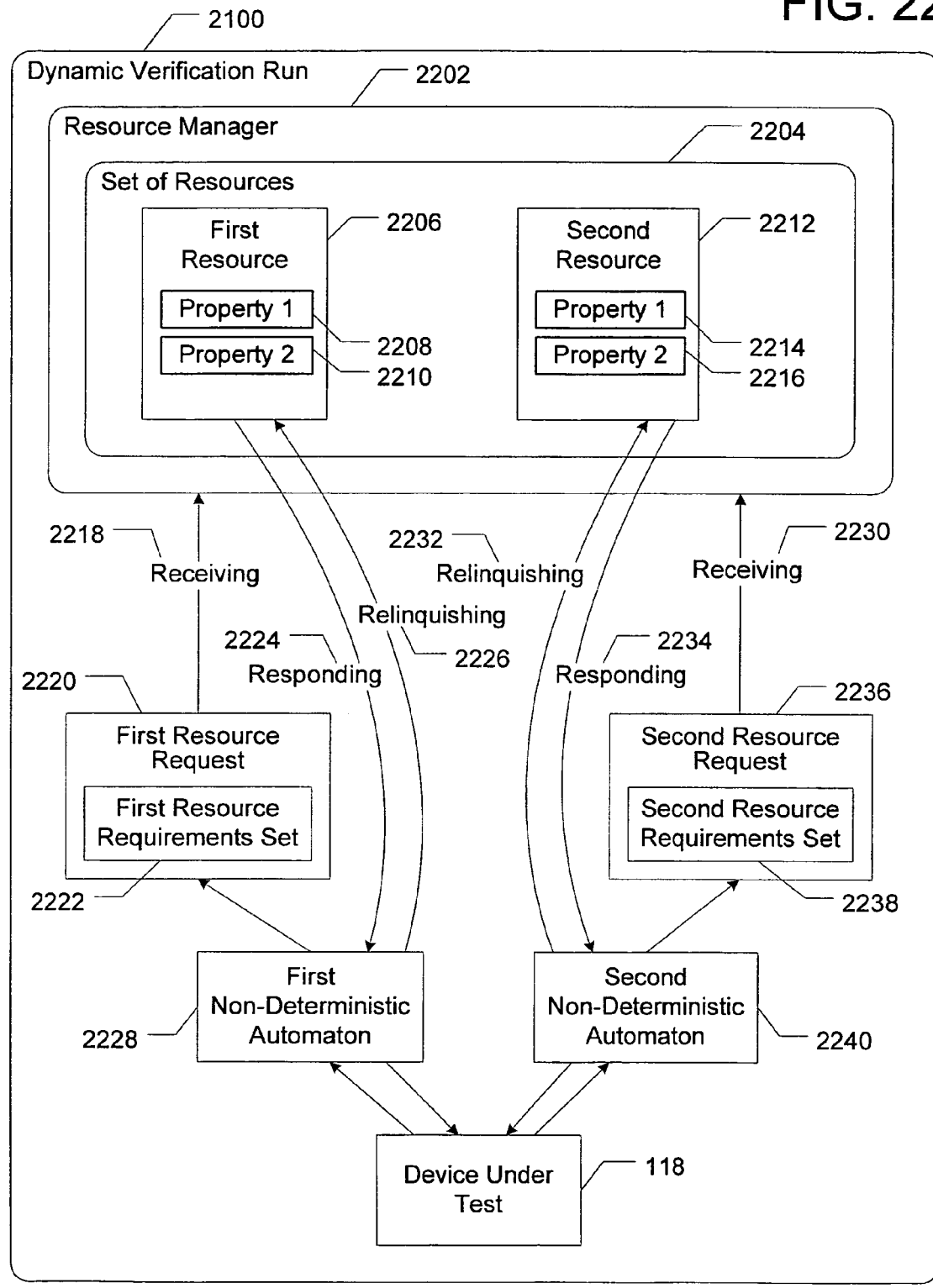
FIG. 22 shows Resource Management during a Dynamic Verification Run.

An example illustrating resource management in a subject embodiment is shown in FIG. 22. A first non-deterministic automaton 2228 issues a first resource request 2220 to resource manager 2202, specifying a first resource requirements set 2222 (e.g. a resource of type "read/write memory", with at least 1 megabyte of space) to meet the requirements of a computation that said automaton is preparing to perform (in this example, the first computation). Upon receiving (operation 2218) the first resource request 2220, resource manager 2202 uses hash table lookups and other mechanisms well-known to those skilled in the art to search for a resource in set of resources 2204 that meets first resource requirements set 2222. Since property 1 (2208), property 2 (2210), and other properties of first resource 2206 meet said requirements, resource manager 2202 sets an "in use" property on first resource 2206, thereby reserving it for exclusive use by first non-deterministic automaton 2228. The resource manager then returns a pointer to first resource 2206 to first non-deterministic automaton 2228, thereby responding (operation 2224) to first resource request 2220. After receiving the response, first non-deterministic automaton 2228 begins performing said first computation. Subsequently a second non-deterministic automaton 2240 issues a second resource request 2236 to resource manager 2202, specifying a second resource requirements set 2238 to meet the requirements of a computation that said automaton is preparing to perform (in this example, the second computation). Upon receiving (operation 2230) the second resource request 2236, resource manager 2202 searches for a resource in set of resources 2204 that meets second resource requirements set 2238. Resource manager 2202 finds that first resource 2206 would satisfy second resource requirements set 2238 except for the fact that it is already in exclusive use, so it does not allow second non-deterministic automaton 2240 to use that resource. Instead, it continues searching and finds second resource 2212 that meets second resource requirements set 2238. Since property 1 (2214), property 2 (2216), and other properties of second resource 2212 meet said requirements, resource manager 2202 sets an "in use" property on second resource 2212, thereby reserving it for exclusive use by second non-deterministic automaton 2240. The resource manager then returns a pointer to second resource 2212 to second non-deterministic automaton 2240, thereby responding (operation 2234) to second resource request 2236. After receiving the response, second non-deterministic automaton 2240 begins performing said second computation. Subsequently, first non-deterministic automaton 2228 finishes performing said first computation. First non-deterministic automaton 2228 notifies resource manager 2202 that exclusive use of first resource 2206 is no longer required, thereby relinquishing (operation 2226) it. Resource manager 2202 clears the "in use" property on first resource 2206 thereby making it available for other uses. Subsequently, second non-deterministic automaton 2240 finishes performing said second computation. Second non-deterministic automaton 2240 notifies resource manager 2202 that exclusive use of second resource 2212 is no longer required, thereby relinquishing (operation 2232) it. Resource manager 2202 clears the "in use" property on second resource 2212 thereby making it available for other uses. A wide variety of other resource request and response scenarios are possible. For example, it often occurs that there are too few resources to satisfy all of the resource requests made by the set of automata that are being traversed. In that case, resource manager 2202 will respond to an automaton's request with a "no matching resource currently available" response. An automaton which receives such a response to a resource request has several choices. Said automaton can simply wait for an appropriate resource to become available, or said automaton can perform alternative computations that do not require exclusive use of a scarce resource (until such a resource becomes available).

Using the resource management mechanism, it becomes very cost effective to reuse automata in a variety of verification applications. In the prior art, resource conflicts are a serious problem in reusing individual test programs in sets together for the verification of various systems, but these resource conflicts can be prevented using automata with a subject embodiment. Using this embodiment, individual previously-written automata can readily be reused in sets together without modification for the verification of various systems with widely differing resources. The unique resource limitations of each system can easily be specified to resource manager 2202 at the beginning of each dynamic verification run 2100, thereby building a system-specific set of resources 2204 from which resources can be secured and to which they can be relinquished as described above.

Operation Flow

Figure 2:
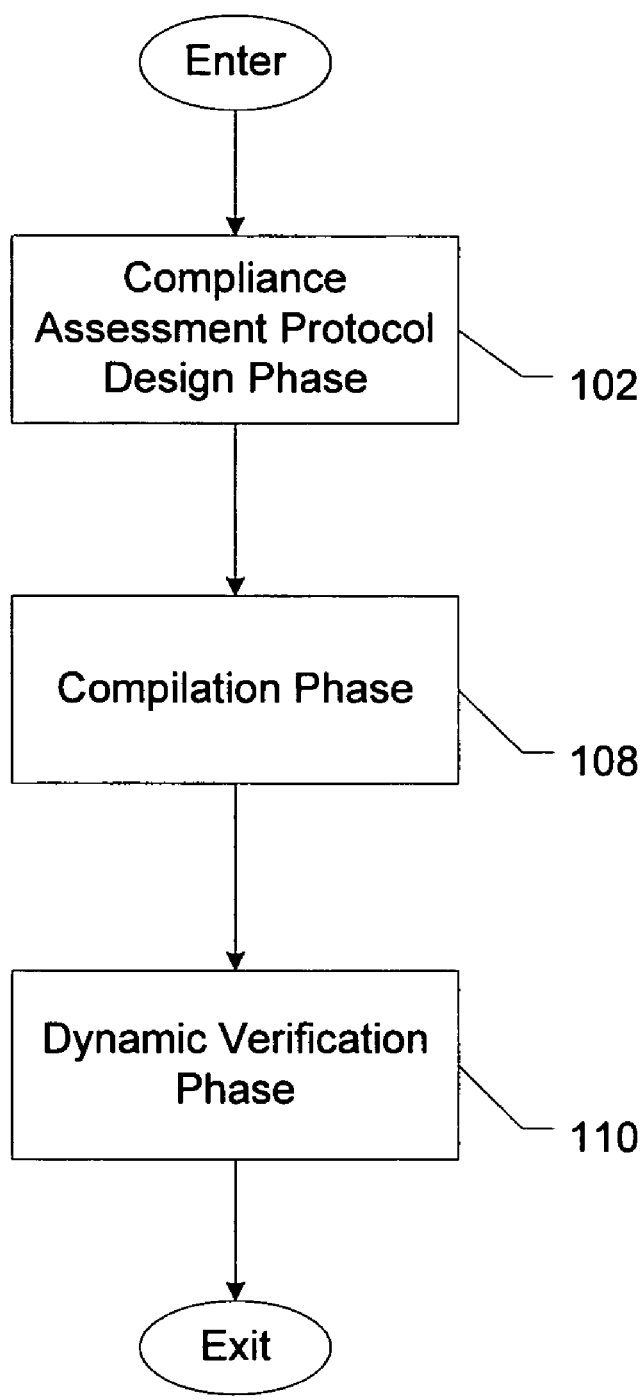
FIG. 2 shows Phases of Compliance Verification.

In a subject embodiment, compliance verification is done by a process that includes the following steps, any of which may done one or more times, e.g., as part of an iterative refinement process, as illustrated in FIG. 2.
1. The Compliance Assessment Protocol Design Phase 102.
2. The Compilation Phase 108.
3. The Dynamic Verification Phase 110.

Compliance Assessment Protocol Design Phase

In a subject embodiment, the compliance assessment protocol design phase 102 includes the following operations, any of which may done one or more times, e.g., as part of a nested iterative refinement process within the overall system verification process (which may itself be an iterative refinement process).
1. The user analyzes the specification of the system to be tested (system specification 104) and the goals of compliance verification.
2. The user creates a set of verification testbenches. Each verification testbench includes an instantiation of the system to be tested (i.e., the DUT 118), instantiations of any desired verification interface modules generated by a subject embodiment (described below), and instantiations of any other desired verification entities such as legacy objects 116 (clock generators, stimulus generators or result checkers prepared using prior art methods, and so forth).
3. The user creates one or more NDAs and verification interface descriptions (VIDs, which are described below) to specify portions of the compliance assessment protocol.
4. The user creates a resource specification function to specify a set of resources and their properties to be recorded in set of resources 2204.

In a subject embodiment, an NDA graph (2108 in FIG. 21) can include several types of objects.
1. Terminal objects, each of which has a name and can point to (i.e. contain a reference to) an action routine 2110 to be called whenever the terminal object is reached during an NDA traversal 1002. Terminal objects do not point to any other objects in the graph.
2. Non-terminal objects, each of which has a name and points to an expression object which implements a subgraph to be traversed whenever the non-terminal is reached during an NDA traversal 1002.
3. Expression objects are terminal objects, non-terminal objects, or any of the following types of objects.
   a) Sequence objects, each of which contains a list of pointers to expression objects to be traversed sequentially in order whenever the sequence object is reached during an NDA traversal 1002.
   b) Alternative set objects, each of which contains a list of pointers to alternative objects, one of which is to be selected and traversed whenever the alternative set object is reached during an NDA traversal 1002. Each alternative object contains a weight as well as a pointer to an expression object to be traversed whenever the alternative object is reached during an NDA traversal 1002.
   c) Repeat objects, each of which contains a pointer to an expression object to be traversed zero or more times in succession whenever the repeat object is reached during an NDA traversal 1002. Each repeat object also contains the minimum number of times the expression object is to be traversed. Each repeat object also contains the maximum number of times the expression object is to be traversed. Said maximum may be "infinity", a special value indicating there is no upper limit to the number of times the expression object can be traversed.

In the NDA 2104, one of the non-terminal objects is designated as the start non-terminal.

In the compliance assessment protocol design phase of a subject embodiment, the user specifies the NDA graph 2108 for each NDA 2104 by writing a NDA graph definition program module (in C++) that constructs the component objects including their connections, and designates a start non-terminal. Techniques for facilitating the specification of graphs in this manner may include supplying class definition header files to the user, and overloading C++ operators.

Figure 25:
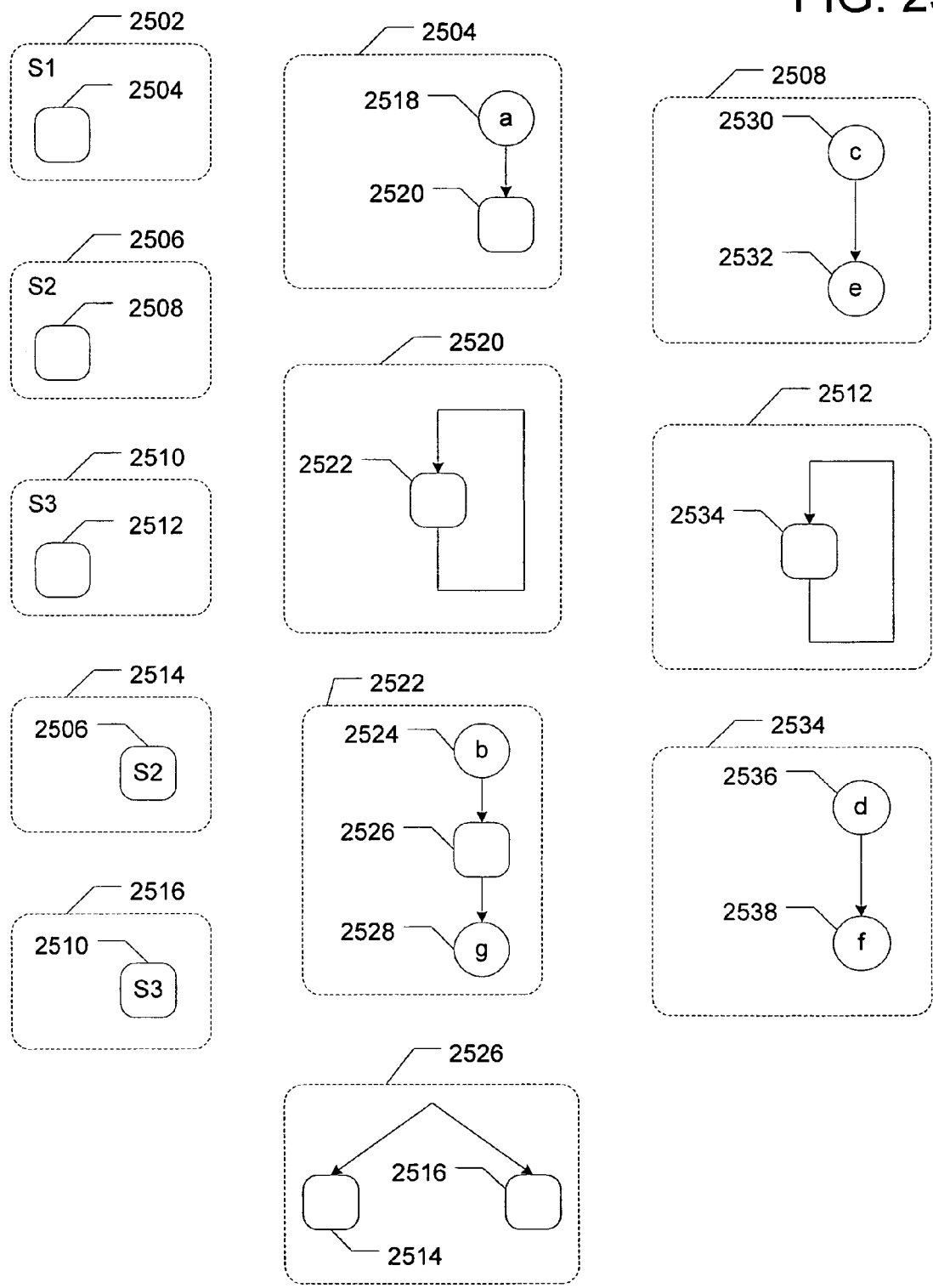
FIG. 25 shows a graph resulting from the graph construction routine shown in FIG. 24.

An example illustrating how a user could create an NDA graph 2108 in a subject embodiment appears in the ConstructGraph() function 2402 in FIG. 24. A view of the resulting graph 2502 appears in FIG. 25. Non-terminal (symbol in FIG. 24) "S1" 2502 contains a pointer to sequence 2504, which consists of a pointer to terminal (action in FIG. 24) "a" 2518 followed by a pointer to repeat 2520. Repeat 2520 contains a pointer to sequence 2522. Sequence 2522 contains a pointer to terminal "b" 2524 followed by a pointer to alternative set 2526 followed by a pointer to terminal "g" 2528. Alternative set 2526 contains a pointer to alternative 2514 and a pointer to alternative 2516. Alternative 2514 contains a pointer to non-terminal "S2" 2506. Alternative 2516 contains a pointer to non-terminal "S3" 2510. Non-terminal "S2" 2506 contains a pointer to sequence 2508. Sequence 2508 contains a pointer to terminal "c" 2530 followed by a pointer to terminal "e" 2532. Non-terminal "S3" 2510 contains a pointer to repeat 2512. Repeat 2512 contains a pointer to sequence 2534. Sequence 2534 contains a pointer to terminal "d" 2536 followed by a pointer to terminal "f" 2538. Using techniques well known to those skilled in the art, an embodiment may transform graph 2502 to other graphs, such as graph 2602 in FIG. 26, for purposes of illustration and communication.

In the compliance assessment protocol design phase of a subject embodiment, the user specifies action routines 2110 by writing functions (e.g. in C++). These functions can include any software code, and in particular can include function calls to achieve the following.

1. Read from the DUT 118 or another part of the verification environment. The information obtained can be used for any desired purpose. One typical use of the information is to perform DUT behavior correctness checks. Another typical use of the information is to determine which sections (e.g. branches) of the action routine code should be executed.
2. Write to the DUT 118 or another part of the verification environment.
3. Synchronize the NDA 2104 and the DUT 118 or another part of the verification environment, so that for example reads from the DUT and writes to the DUT are done when the DUT is in an appropriate state. Synchronization mechanisms include the following types of synchronization directive (2308 of FIG. 23):
    a) WAIT_FOR(event handle), which causes the thread on which the action routine is running to be suspended until the event corresponding to event handle occurs. Said event is an example of a synchronization condition (2320 in FIG. 23).
    b) WAIT_FOR(duration), which causes the thread on which the action routine is running to be suspended for the amount of simulation time specified by duration. The completion of the specified duration of simulation time is an example of a synchronization condition 2320.
    c) WAIT_FOR(wakeup handle), which causes the current NDA instance's pending wakeup counter to be checked. The following counter check and possible decrement must be accomplished as an atomic action to avoid errors that may be introduced by simultaneous action. If said pending wakeup counter is greater than zero, said pending wakeup counter is decreased by one and the action routine continues. Otherwise, the thread on which the action routine is running is suspended until the pending wakeup counter exceeds zero, at which point the following operations are performed: the pending wakeup counter is decreased by one, the DUT thread 306 is suspended, and the thread on which the action routine is running is resumed.
    d) Target-NDA-Instance→WAKEUP(), which causes the target NDA instance's pending wakeup counter to be increased by one.
4. Modify the NDA using NDA graph modification directives 2116 as described above.
5. Modify the NDA traversal mechanism 2114 using an NDA traversal mechanism modification directive 2118 as described above. For example, when the NDA traversal mechanism 2114 is using the pseudo-random traversal strategy, a call to a Skip(target-terminal) function will cause the NDA traversal mechanism 2114 to temporarily change to using the skip traversal strategy to reach a specified target terminal object without calling the action routines 2110 of any other terminal objects reached before reaching the specified terminal object.
6. Constrain the subsequent NDA traversal 1002 of the NDA 2104 using a "set of traversal constraints" modification directive 2120 as described above. For example, a call to a Force(target-terminal) function will require the NDA traversal mechanism 2114 to traverse a specified target terminal object before traversing any other terminal object. Also for example, a call to an AdjustLoopLimit function will require the NDA traversal mechanism 2114 to stop a repeat object from repeating traversal of its encompassed expression object when a specified number of additional traversals of its encompassed expression object is completed
7. Request exclusive use of a resource by specifying a set of requirements for the resource to the resource manager 2202, as described above.
8. Relinquish exclusive use of a resource by notifying the resource manager 2202 that exclusive use of a specific resource is no longer required, as described above.
9. Read from or write to a data object. Each NDA instance has a data object specified by the user. A common use for a data object is to pass information between action routines 2110 of an NDA instance so that a series of action routines can cooperate to perform a computation. Another use for a data object is to pass information between action routines of separate NDA instances which need to cooperate in some way.
10. Find a specified NDA instance using the name of the NDA and the instance name of a verification interface module. One reason to use the find function is to call Specified-NDA-Instance→WAKEUP(). Another reason to use the find function is to enable a read from or a write to the specified NDA instance's data object. Another reason to use the find function is to enable the action routines 2110 of one NDA 2104 to issue NDA graph modification directives 2116 to a second NDA 2104. Another reason to use the find function is to enable the action routines 2110 of one NDA 2104 to issue NDA traversal mechanism modification directives 2118 to an NDA traversal mechanism 2114 that is traversing a second NDA 2104. Yet another reason to use the find function is to enable the action routines 2110 of one NDA 2104 to issue "set of traversal constraints" modification directives 2120 to modify a set of traversal constraints 2112 on an NDA traversal mechanism 2114 for an NDA traversal 1002 of a second NDA 2104.

11. Terminate the current dynamic verification run 2100. If the DUT 118 is being executed by a simulator that has a termination function, a subject embodiment will call it.
12. Interrupt the current dynamic verification run 2100 and enable the user to enter commands interactively. If the DUT 118 is being executed by a simulator that has an interactive user interface, a subject embodiment causes it to become active.

In the compliance assessment protocol design phase of a subject embodiment, the user specifies an NDA user initialization function for each NDA 2104. This function can include any software code (e.g. in C++). Typically the NDA user initialization function calls subject embodiment functions to set each terminal object's action routine pointer to the appropriate action routine in accordance with the compliance assessment protocol.

In the compliance assessment protocol design phase of a subject embodiment, the user creates one or more verification interface descriptions (VIDs). Each VID specifies the verification interface for one or more the NDAs, and may include the following information.
1. Input and output pin definitions.
2. Instantiation parameter definitions, which can be used to customize behavior such as setup times and hold times.
3. Identification of which NDAs are encompassed by the VID, i.e., those NDAs for which the VID provides an interface.
4. For each NDA 2104 in the VID, identification of the shared library that contains the compiled action routines 2110 and the compiled initialization function for that NDA.
5. Internal signal handle definitions, an example of use of which is to enable the action routines 2110 to read or drive any desired DUT 118 internal wires or registers.
6. Event definitions which associate an event handle with an event where said event is specified by an event expression in a language supported by the verification environment. An event definition may also include a level expression in said language, in which case the event is deemed to occur only when the event expression is triggered and the level expression is true. One way event handles can be used is in WAIT_FOR function calls (i.e. synchronization directives 2308) in action routines 2110 when synchronizing with the DUT 118 or another part of the verification environment.
7. For each NDA 2104 in the VID, identification of the NDA traversal mechanism reset event.
8. Local variable definitions, which result in declarations of local variables in the verification interface module corresponding to the VID.
9. Clock definitions, including the length of the high period, the length of the low period, an optional begin event, and an optional end event.
10. Duration definitions, which associate a duration handle with the value of an expression representing an amount of simulation time.
11. Wakeup definitions specify a wakeup handle for use in action routines 2110. One way a wakeup handle can be used is in a WAIT_FOR function call synchronization directive 2308 in an action routine when synchronizing a plurality of NDAs.

In the compliance assessment protocol design phase of a subject embodiment, the user may create a resource specification function. This function can include any software code (e.g. in C++). Typically the resource specification function calls subject embodiment functions to construct resource objects if any are required and to specify the properties of said resource objects. A subject embodiment automatically marks said resource objects "available" and adds them to the set of resources 2204.

In a subject embodiment, resource objects can be constructed with pre-defined properties which are appropriate for many applications, including the following:
   a master/slave property,
   an integer device-type property, which can be used to specify membership in a user-defined set of similar devices,
   an address range property,
   a "can be read" property,
   a "can be written" property,
   a "can be directly loaded" property, which can be used to specify that data can be written to the device through a direct data-loading mechanism,
   an uninitialized property,
   an "is memory" property,
   an "is FIFO" property, which can be used to specify that the resource is not addressable,
   an "is scratch pad" property, which can be used to specify that the resource is only accessible from the CPU,
   a "has external address" property, which can be used to specify that the resource can be addressed by an external master, and
   a busy/not busy property, which is used by the subject embodiment to mark whether the resource has been secured for exclusive use or is currently available.

Resource objects can also have additional properties specified by the user.

Compilation Phase

In a subject embodiment, the compilation phase includes the following operations, any of which may done one or more times, e.g., as part of an iterative refinement process.
1. A subject embodiment reads each VID and generates a corresponding verification interface module which (during the dynamic verification phase 110) provides an interface between the NDAs encompassed by the VID and the DUT 118 and, if necessary, between the NDAs in the VID and other parts of the verification environment. The verification interface module may also include local variable declarations and clock generation. The verification interface module also includes WAIT_FOR synchronization directive function support code.
2. A subject embodiment compiles the action routines 2110 and the NDA initialization function for each NDA 2104, and stores the resulting object modules in the shared library specified in the VID that encompasses the NDA.
3. A subject embodiment compiles the NDA graph definition program module for each NDA 2104, links the resulting object module with a shared library from an embodiment, and then executes the resulting program to generate a binary NDA graph file. The binary NDA graph file contains a binary representation of the NDA graph 2108 that can be rapidly loaded in a dynamic verification run 2100.
4. A subject embodiment compiles the resource specification function, and adds it to a shared library listed by a VID whose corresponding verification interface model is instantiated in the verification testbench.

Dynamic Verification Phase

Figure 3:
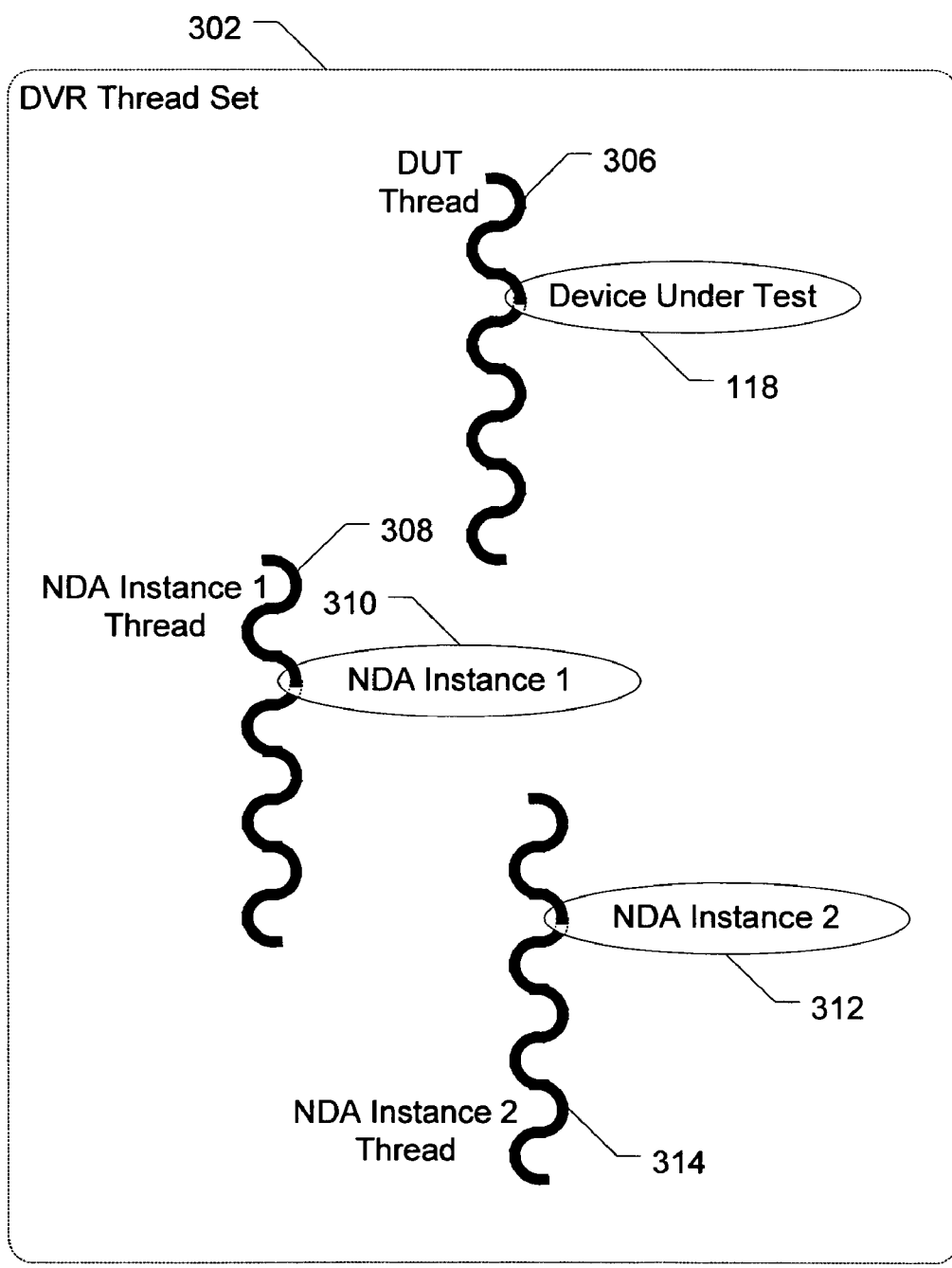
FIG. 3 shows Threads in a Dynamic Verification Run including the DVR Thread Set.
Figure 4:
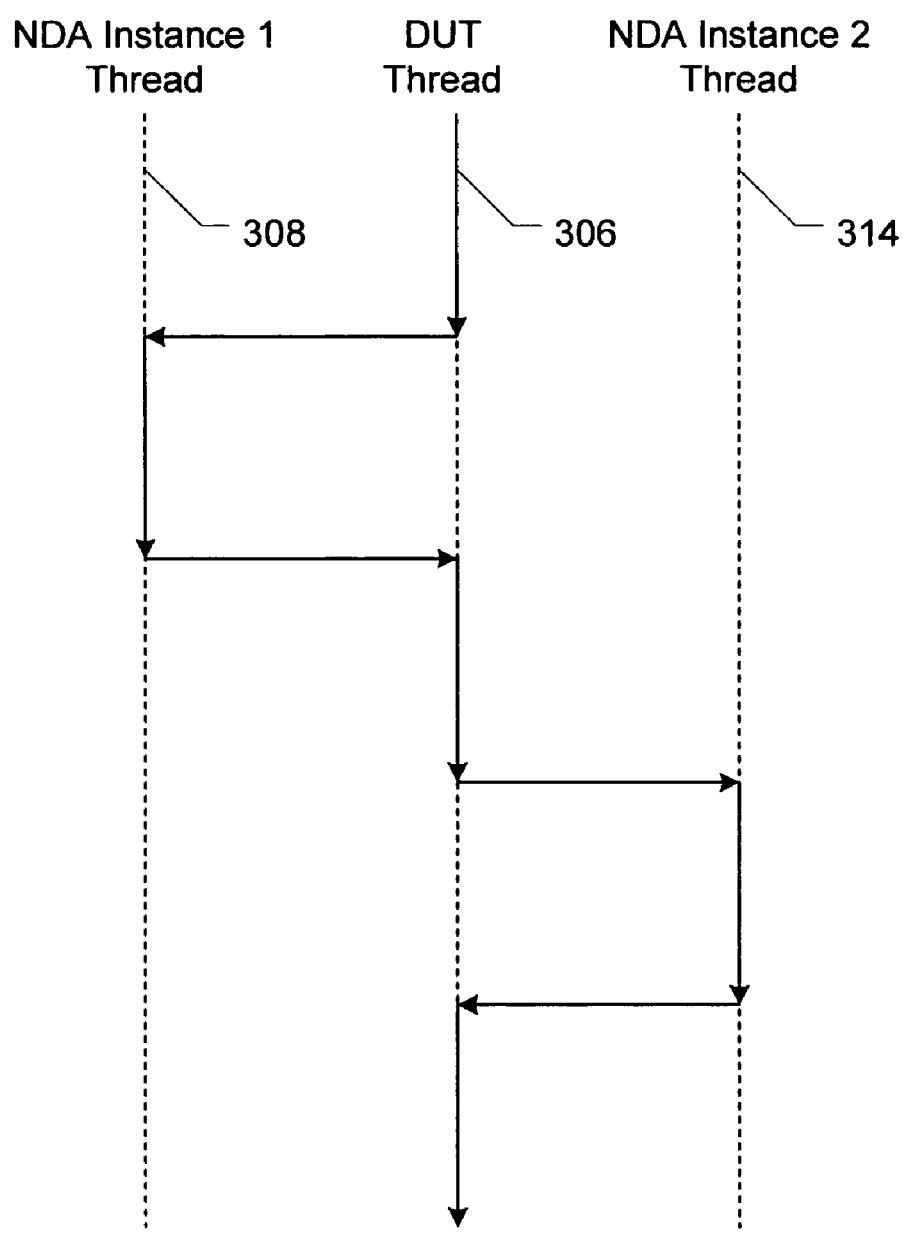
FIG. 4 shows a first example of Threads in a Dynamic Verification Run.
Figure 5:
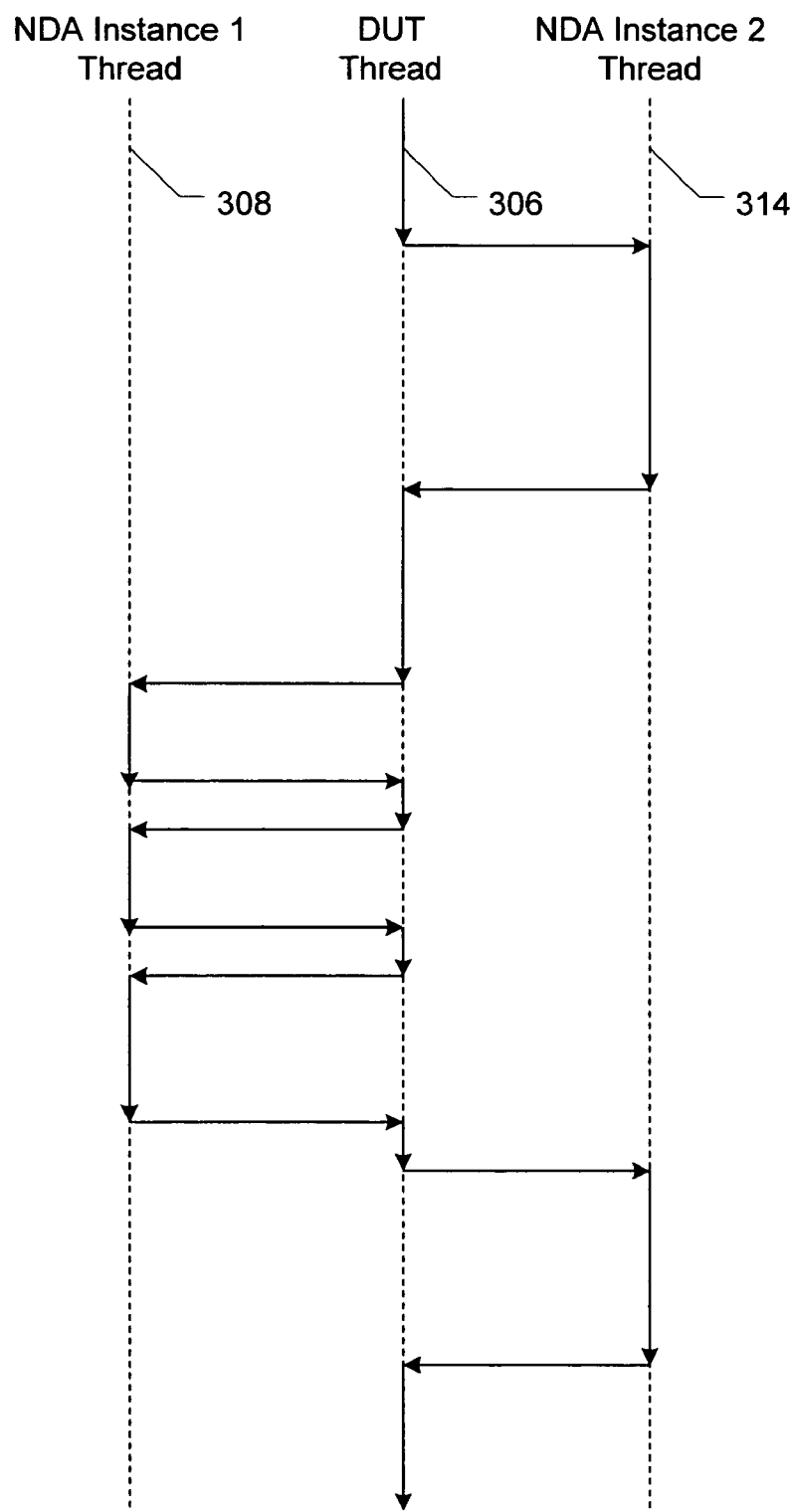
FIG. 5 shows a second example of Threads in a Dynamic Verification Run.

In a subject embodiment, the dynamic verification phase 110 comprises one or more dynamic verification runs. For purposes of explanation, the dynamic verification phase of a subject embodiment that is used with NC-Verilog™, available from Cadence Design Systems, Inc., is described. Other embodiments that work with other simulators are possible and can be easily constructed from the teachings herein.

Threads in a Dynamic Verification Run In a subject embodiment, a plurality of threads is used during a dynamic verification run 2100, as illustrated by the example shown in FIG. 3. Typically the DUT 118 runs in one thread 306, referred to below as the DUT thread. If a simulator is needed for the DUT in a dynamic verification run 2100, the simulator runs in DUT thread 306 (otherwise a DUT interface or the DUT itself runs in DUT thread 306). For each instantiation of a verification interface module, an NDA instance thread 308/314 is dynamically created for each NDA 2104 that is encompassed by the corresponding VID; the thread is used for processing the corresponding NDA instance 310/312 including NDA traversal 1002 and action routine execution. The set of threads consisting of the DUT thread 306 and the NDA instance threads 308/314 will be referred to below as the DVR thread set 302. Thread execution is controlled so that only one member of the DVR thread set is performing verification tasks at any time, and the other members are suspended. The first member of the DVR thread to execute is the DUT thread 306. From time to time the execution of the DUT thread is suspended, and one of the NDA instance threads 308/314 is allowed to execute. Said NDA instance thread is later suspended and the execution of the DUT thread 306 is resumed. Various example thread interactions are illustrated in vertical timelines in FIG. 4 and FIG. 5, (in these drawings an executing thread is shown with a solid line, and a suspended thread is shown with a dashed line). Since, for these embodiments, only one member of the DVR thread set 302 may be active at any one time, action routines 2110 in each NDA 2104 need not be thread-safe, and any other verification software designed for single-threaded verification environments (as many executable DUTs and DUT simulators are) need not be thread-safe (e.g. there is no need to use mutexes to guard accesses to data shared between two NDAs, or data shared between an NDA and the DUT or the DUT simulator).

Figure 23:
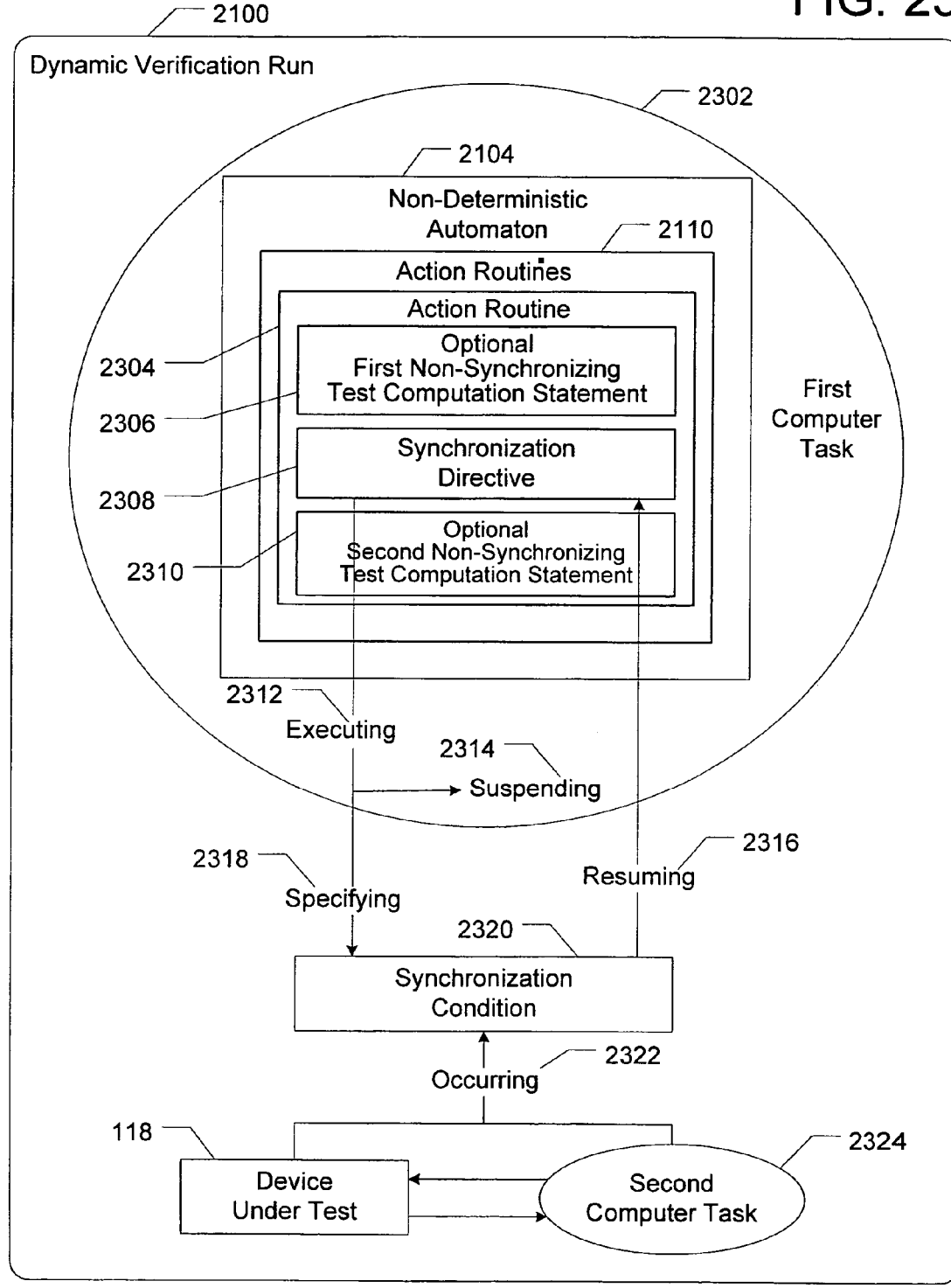
FIG. 23 shows Automaton Synchronization during a Dynamic Verification Run.

In a subject embodiment, as illustrated in FIG. 23, an NDA 2104 being processed in a first computer task 2302 (e.g. a first NDA instance thread 308) can be synchronized with the DUT 118 and/or a second computer task 2324 (which may be a second NDA instance thread 314 processing a different NDA). Synchronization begins with the executing 2312 of a synchronization directive 2308, thereby specifying 2318 a synchronization condition 2320 (e.g. a DUT "ready" signal changing from logic high to logic low). Suspending 2314 of the first computer task 2302 follows. Subsequently, the activity of the DUT 118, the activity of the second computer task 2324, or a combination thereof results in the occurring 2322 of the synchronization condition (e.g. logic low on the "ready" signal). Subsequently, resuming 2316 of first computer task 2302 is done at the point immediately after synchronization directive 2308. In this way, an NDA 2104 can be synchronized with the DUT and/or any other object or set of objects in the verification environment. Note that a synchronization directive 2308 may appear anywhere in action routine 2304. In particular, it may appear before the non-synchronizing test computation statements in the action routine (if any), after the non-synchronizing test computation statements in the action routine (if any), or between any two non-synchronizing test computation statements in the action routine, such as after optional first non-synchronizing test computation statement 2306 and before optional second non-synchronizing test computation statement 2310. (A non-synchronizing test computation statement is any test computation statement other than a synchronization directive).

Dynamic Verification Run

Figure 6:
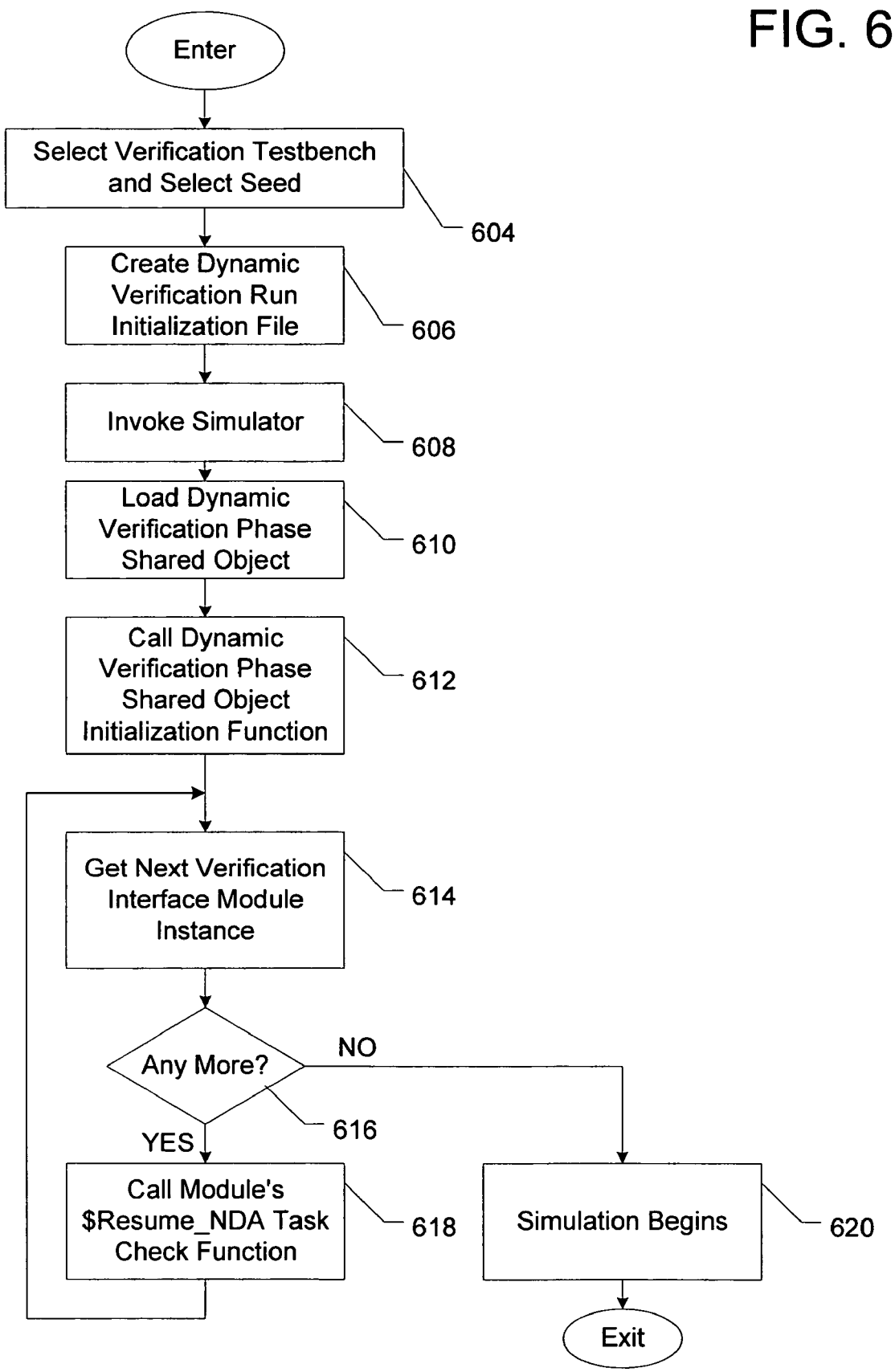
FIG. 6 shows steps in the starting of a Dynamic Verification Run.

In the subject embodiments that use NC-Verilog™, each dynamic verification run 2100 includes the following operations, as illustrated in FIG. 6.

Figure 7:
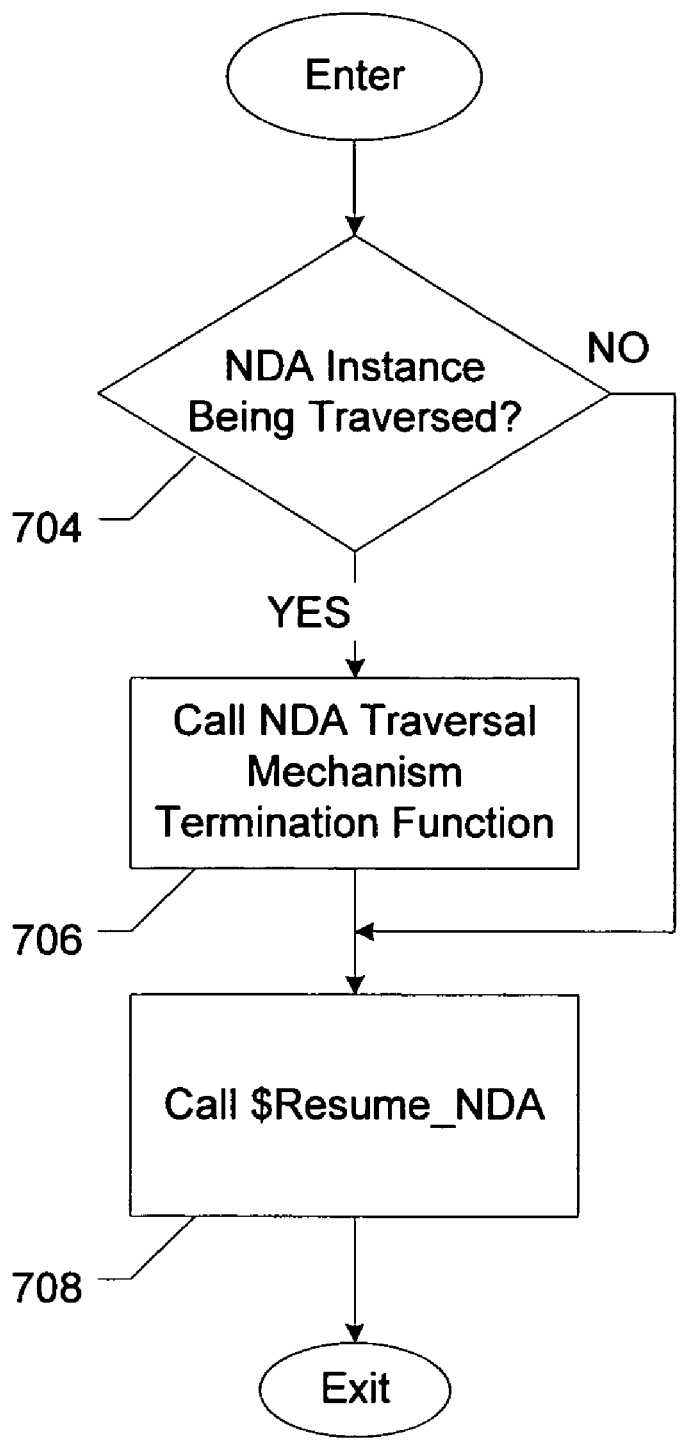
FIG. 7 shows steps in the processing of an NDA Traversal Mechanism Reset Event.
Figure 8:
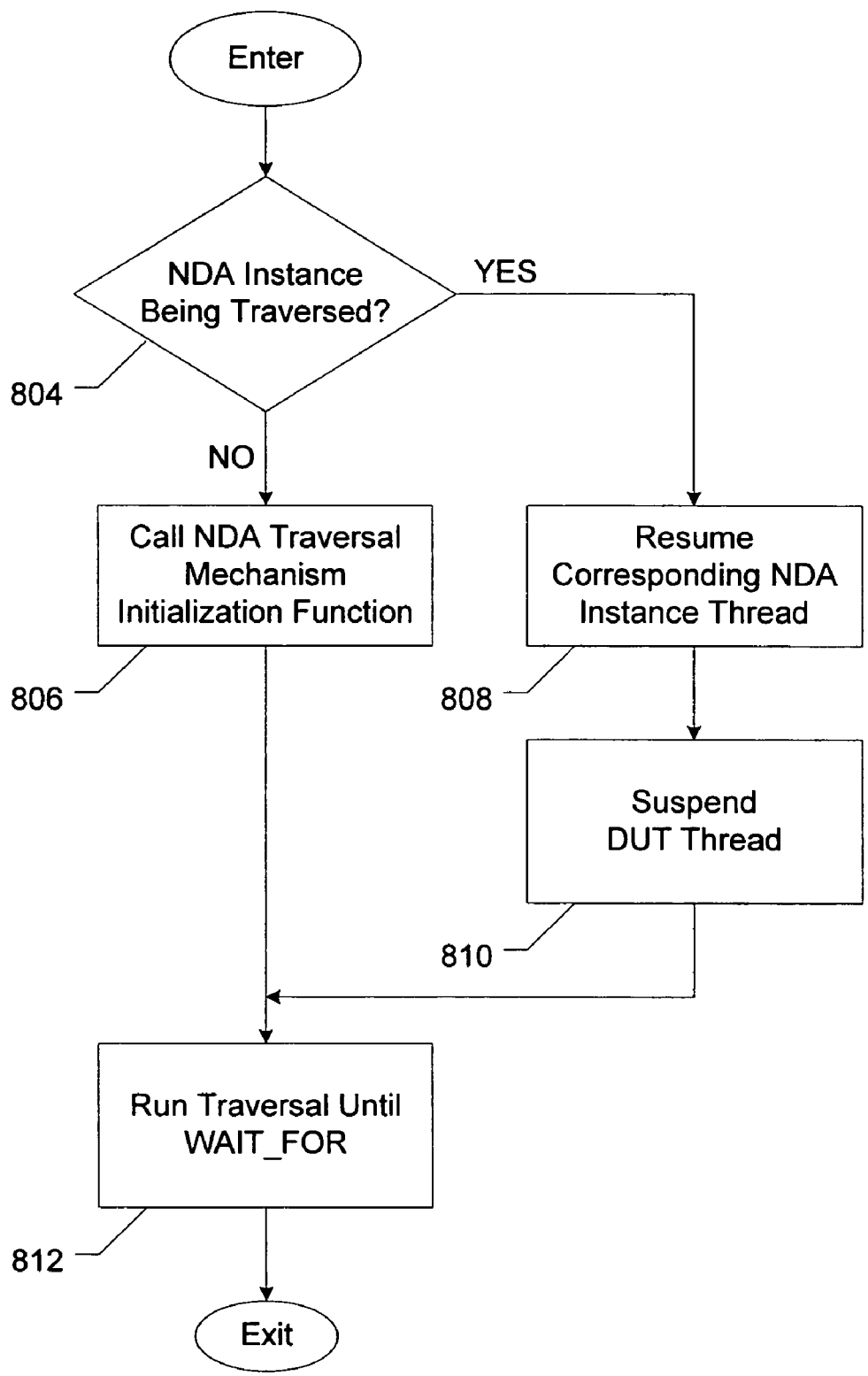
FIG. 8 shows steps in the processing of a call to the $Resume_NDA task.

1. The user selects a verification testbench and a seed for the pseudo-random traversal strategy (operation 604). The user creates a dynamic verification run initialization file which specifies the seed, and also lists each VID file name and the name of the verification interface module that was generated from it (operation 606).
2. The user invokes the NC-Verilog™ simulator on the verification testbench (operation 608), passing in the name of the dynamic verification run initialization file and the name of a subject embodiment's dynamic verification phase shared object implementation for NC-Verilog™.
3. NC-Verilog™, executing in the DUT thread 306, loads the dynamic verification phase shared object implementation for NC-Verilog™ (operation 610) and calls its initialization function (operation 612). This function registers Verilog tasks used in verification interface modules, including the $Resume_NDA task. This function also reads the dynamic verification run initialization file, using the pseudo-random traversal strategy seed to initialize a pseudo-random number generator, and using the VID file/verification interface module name correspondence information to generate a VID file lookup data structure in memory. This function also calls the resource specification function.
4. For each instantiation of a verification interface module, NC-Verilog™ calls the check function for the $Resume_NDA task in the module definition (operations 614, 616 and 618). The check function obtains the instance name and the module name from the simulator, and uses that information to obtain the corresponding VID file name from the VID file lookup data structure. The check function then reads the VID to obtain a list of the NDAs it encompasses. For each NDA 2104 the check function calls the NDA user initialization function for the NDA.
5. NC-Verilog™ begins the simulation (operation 620).
6. When an NDA traversal mechanism reset event occurs, if the corresponding NDA instance is currently being traversed, the NDA traversal mechanism termination function is called, which stops traversal. In either case, the $Resume_NDA task is called. This is illustrated by operations 704, 706 and 708 in FIG. 7.
7. When the $Resume_NDA task is called, if the corresponding NDA instance is not being traversed, the NDA traversal mechanism initialization function is called, which starts a new NDA instance thread and suspends the DUT thread 306. If the corresponding NDA instance is being traversed, the corresponding NDA instance thread is resumed and the DUT thread is suspended. In either case, the NDA traversal 1002 typically continues until a WAIT_FOR synchronization directive 2308 is encountered. This is illustrated by operations 804, 806, 808, 810 and 812 in FIG. 8.
8. Whenever any action routine 2110 executes a WAIT_FOR (event handle) synchronization directive function call, the NDA instance thread in which the action routine is running is suspended, the DUT thread 306 is resumed, a return from the $Resume_NDA task is executed, and NC-Verilog™ resumes. The generated Verilog code in the corresponding Verilog interface module then waits until the event corresponding to the event handle occurs in the simulation, at which point $Resume_NDA is called again.

9. Whenever any action routine 2110 executes a WAIT_FOR (duration) synchronization directive function call, the NDA instance thread in which the action routine is running is suspended, the DUT thread 306 is resumed, a return from the $Resume_NDA task is executed, and NC-Verilog™ resumes. The generated Verilog code in the corresponding Verilog interface module then waits until duration amount of simulation time has passed, at which point $Resume_NDA is called.

Figure 9:
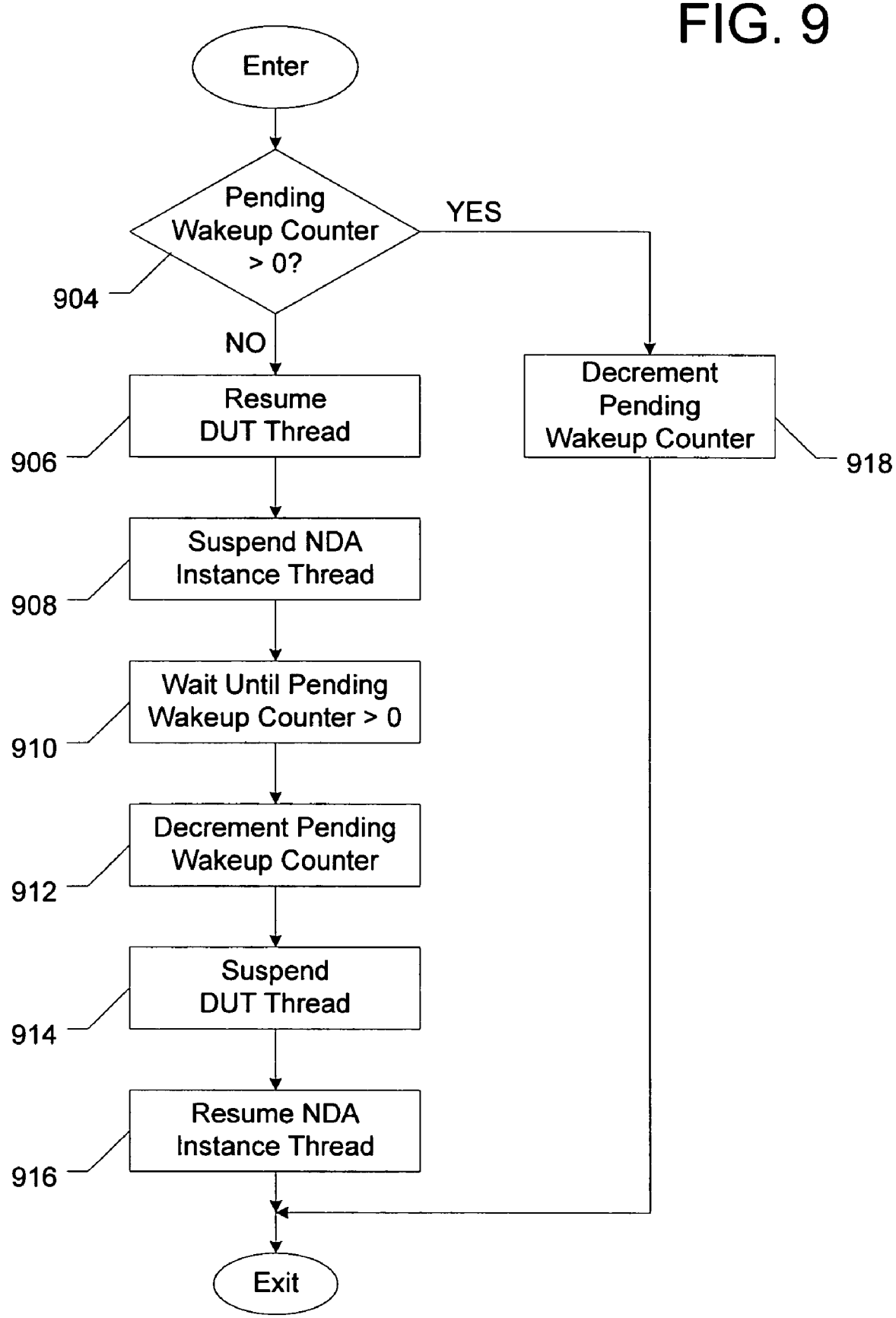
FIG. 9 shows steps in the processing of a call to a WAIT_FOR(Wakeup Handle).

10. Whenever any action 2110 routine executes a WAIT_FOR(wakeup handle) synchronization directive function call, the current NDA instance's pending wakeup counter is checked (operation 904). If said pending wakeup counter is greater than zero, said pending wakeup counter is decreased by one (operation 918) and the action routine continues. Otherwise, the DUT thread 306 is resumed (operation 906) and the thread on which the action routine is running is suspended (operation 908) until said pending wakeup counter exceeds zero 910, at which point the following operations are performed: said pending wakeup counter is decreased by one (operation 912), the DUT thread 306 is suspended (operation 914), and the thread on which the action routine is running is resumed (operation 916). This is illustrated in FIG. 9.

In the dynamic verification phase 110 of a subject embodiment, the following three functions are made available.

1. The function TerminalCanBeReached(terminal object pointer, NDA graph object pointer) returns a boolean (i.e., true for yes, false for no) response to the following question: "Does there exist a traversal of the NDA subgraph starting at the NDA graph object pointed to by NDA graph object pointer such that the terminal object pointed to by terminal object pointer is reached?"

2. The function TerminalCanBeFirst(terminal object pointer, NDA graph object pointer) returns a boolean response to the following question: "Does there exist a traversal of the NDA subgraph starting at the NDA graph object pointed to by NDA graph object pointer such that the terminal object pointed to by terminal object pointer is the first terminal object reached?"

3. The function TerminalsCanBeAvoided(NDA graph object pointer) returns a boolean response to the following question: "Does there exist a traversal of the NDA subgraph starting at the NDA graph object pointed to by NDA graph object pointer such that no terminal object is reached?"

NDA Traversal Mechanism

Figure 10:
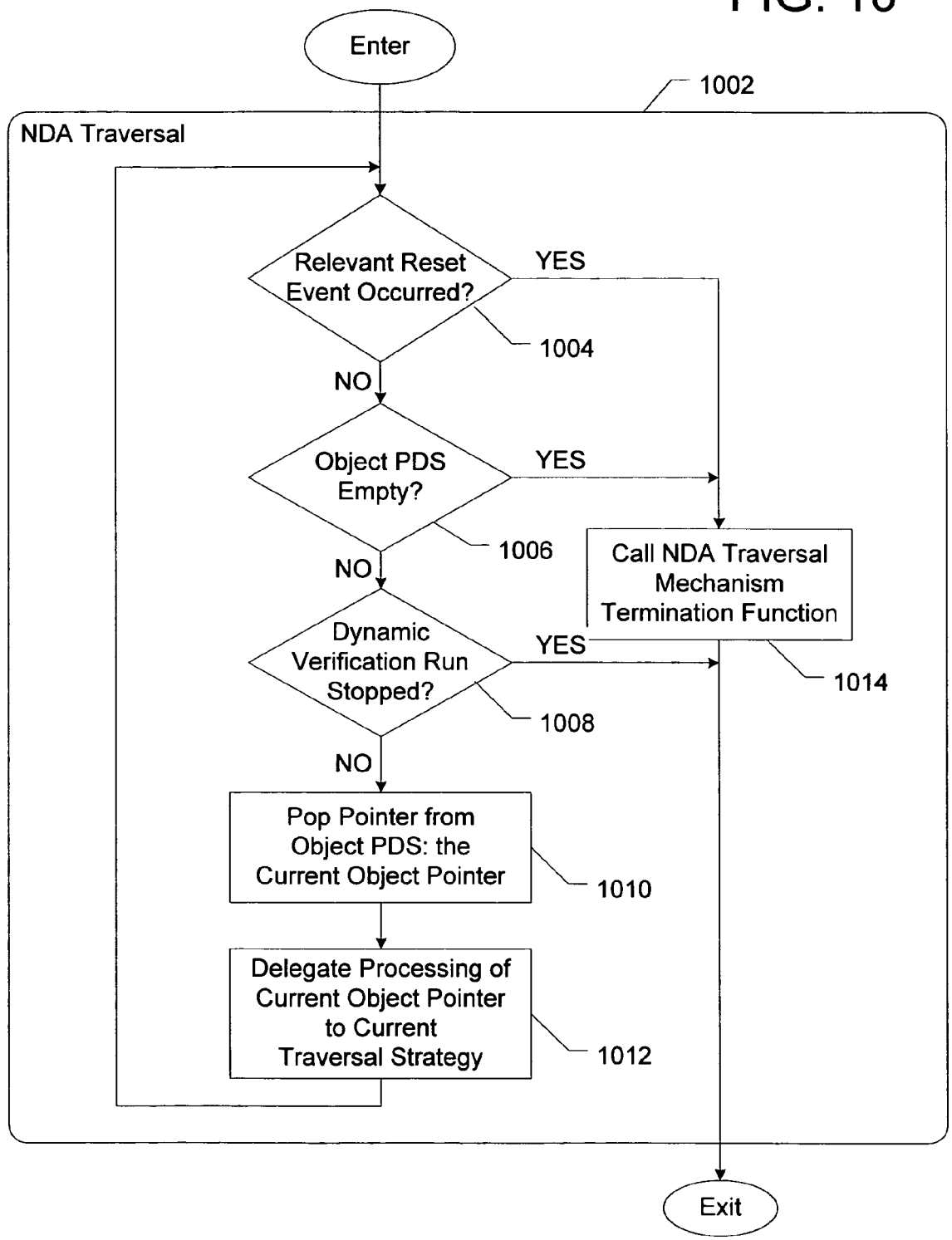
FIG. 10 shows steps of NDA Traversal.

In the dynamic verification phase 110 of a subject embodiment, the NDA traversal mechanism 2114 operates as described below. NDA traversal 1002 begins when an NDA traversal mechanism initialization function is called. During initialization the DUT thread 306 is suspended and a new NDA instance thread is created for processing the NDA 2104, including traversal and execution of action routines 2110. The NDA traversal mechanism 2114 uses traversal strategies to carry out much of the traversal work. The invention allows any number of traversal strategies, but a subject embodiment provides three (described below): (a) the pseudo-random traversal strategy, (b) the force traversal strategy, which is used in a subject embodiment to implement Force traversal constraints, and (c) the skip traversal strategy. The NDA traversal mechanism 2114 has a push-down stack that holds pointers to traversal strategies (the strategy PDS). During initialization the NDA traversal mechanism 2114 pushes a pointer to the pseudo-random traversal strategy onto the strategy PDS, so that it can be the default traversal strategy. The NDA traversal mechanism 2114 also has a push-down stack that holds pointers to various NDA graph objects and control objects (the object PDS). During initialization the NDA traversal mechanism 2114 pushes a pointer to the NDA's start non-terminal onto the object PDS, so that the traversal will start there. After initialization, the NDA traversal mechanism repeatedly executes the following two-operation procedure whenever said NDA instance thread is executing until the object PDS is empty (1006), a relevant reset event occurs (1004), or the dynamic verification run 2100 is stopped (1008). This is illustrated in FIG. 10.

1. The NDA traversal mechanism 2114 pops an object pointer from the object PDS (the current object pointer) (operation 1010).

2. The NDA traversal mechanism 2114 delegates processing of the current object pointer to the current traversal strategy (i.e., the traversal strategy which is pointed to by the traversal strategy pointer at the top of the strategy PDS.) (operation 1012).

During traversal 1002, if the object PDS becomes empty or a relevant reset event occurs, an NDA traversal mechanism termination function is called (operation 1014). During termination, the NDA's termination function is called (if specified by the user), thereby providing a mechanism for cleaning up any data structures created by executing the action routines 2110. Also during termination, the object PDS and the traversal PDS are cleared. Also during termination, the NDA instance thread is destroyed.

Pseudo-Random Traversal Strategy

Figure 11:
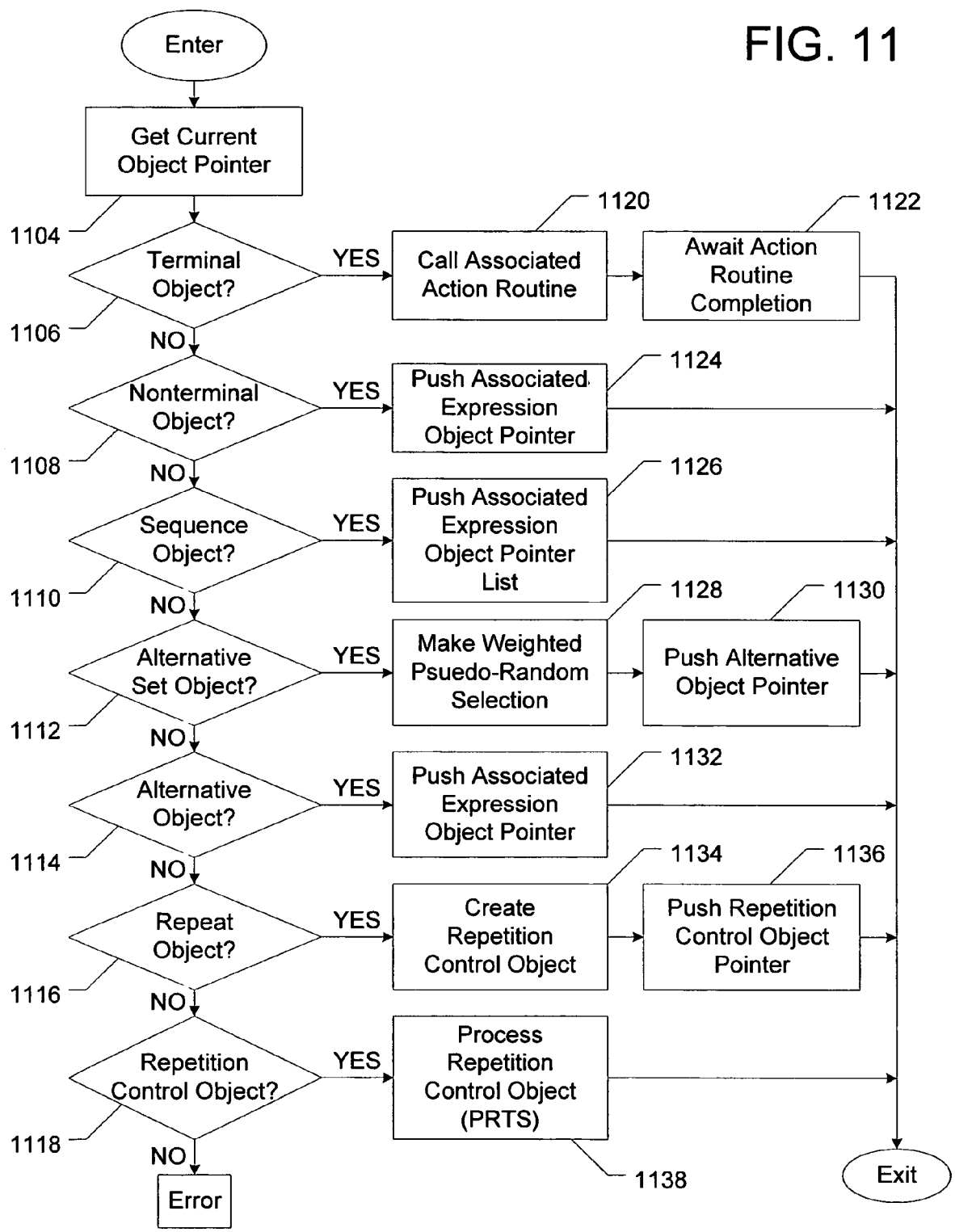
FIG. 11 shows steps in the Pseudo-Random Traversal Strategy.

In the dynamic verification phase 110 of a subject embodiment, the pseudo-random traversal strategy (PRTS) processes the current object pointer as described below. This is illustrated in FIG. 11. The objective of a PRTS is to traverse the NDA 2104 in a pseudo-random manner so that a wide variety of tests are produced.

1. The current object pointer is obtained (operation 1104).

2. If the current object pointer points to a terminal object, the PRTS uses the action routine pointer stored in the terminal object (if any) to call the corresponding action routine and then waits for said action routine to return (operations 1106, 1120 and 1122).

3. If the current object pointer points to a non-terminal object, the PRTS pushes the pointer to the expression object stored in the non-terminal object onto the object PDS (operations 1108 and 1124).

4. If the current object pointer points to a sequence object, the PRTS pushes each expression object pointer in the sequence object's list of expression object pointers onto the object PDS in reverse order (i.e., the expression object pointer at the end of the sequence is pushed onto the object PDS first, and the expression object pointer at the beginning of the sequence is pushed onto the object PDS last) (operations 1110 and 1126).

Figure 12:
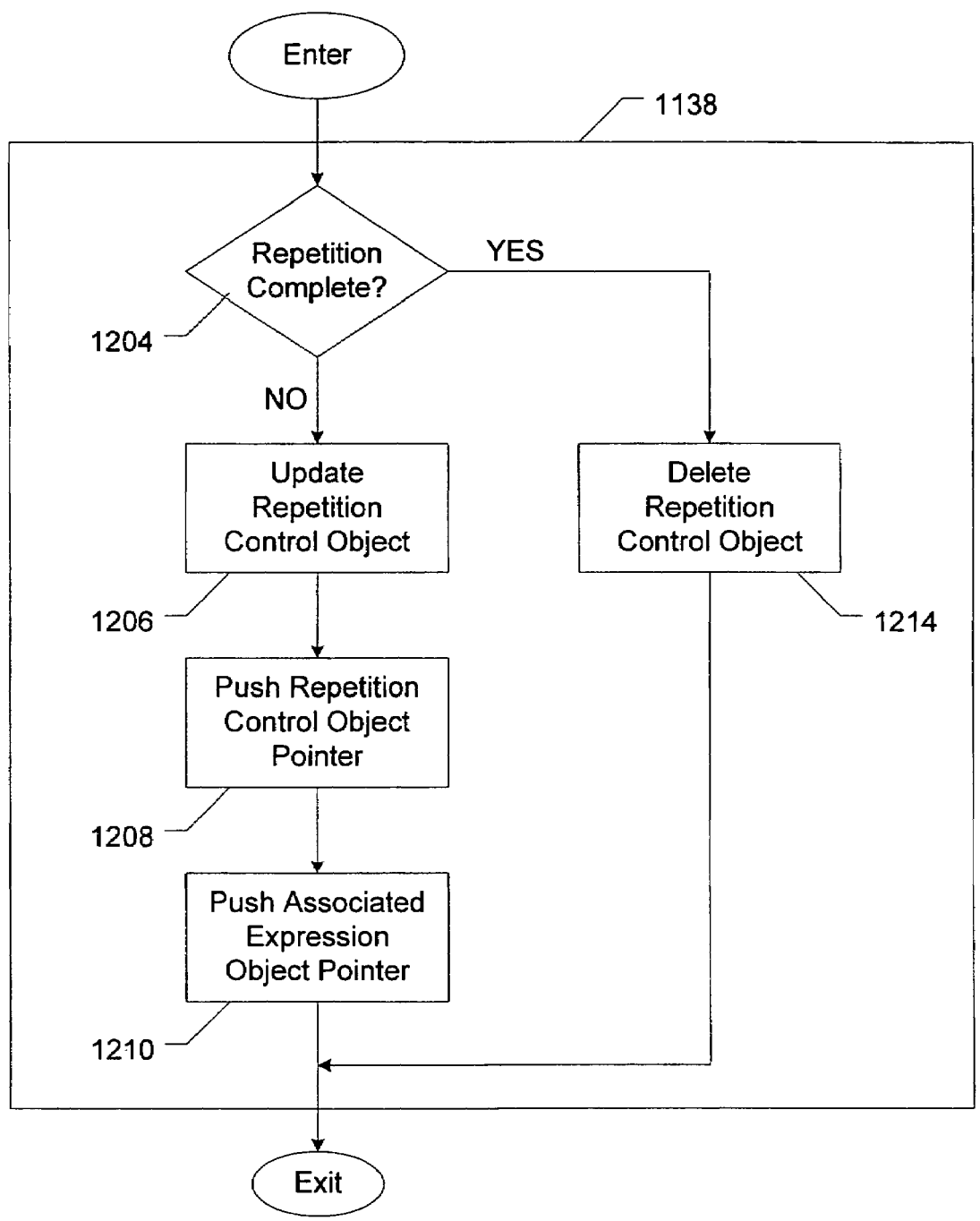
FIG. 12 shows steps in the processing of a Repetition Control Object by the Pseudo-Random Traversal Strategy.

5. If the current object pointer points to an alternative set object, the PRTS makes a weighted pseudo-random selection of one of the alternative object pointers in its alternative object pointer list, and pushes the selected alternative object pointer onto the object PDS. The weights used in the weighted pseudo-random selection process are taken from the alternative objects pointed to by the pointers on the alternative set object's alternative object pointer list. The PRTS's weighted pseudo-random selection method does not consider for selection any alternative object that has a weight of zero (operations 1112, 1128 and 1130).
6. If the current object pointer points to an alternative object, the PRTS pushes the pointer to an expression object stored in the alternative object onto the object PDS (operations 1114 and 1132).
7. If the current object pointer points to a repeat object, the PRTS creates a repetition control object that contains the following data members (operations 1116, 1134 and 1136).
    a) A pointer to the repeat object.
    b) A repetition counter, which is initialized to zero.
    c) A repetition target, which can be a finite number or infinity (i.e., a value which is greater than any possible value of the repetition counter). The repetition target is initialized as follows. If the value of the repeat object's maximum is a finite value, the PRTS sets the repetition target to a pseudo-random integer between the repeat object's minimum and the repeat object's maximum (inclusive). If the value of the repeat object's maximum is infinity, the repetition target is initialized to infinity.
    After creating the repetition control object, the PRTS pushes a pointer to that object onto the object PDS.
8. If the current object pointer points to a repetition control object, the repetition control object is processed (operations 1118 and 1138). In a subject embodiment, PRTS does the following, as illustrated in FIG. 12.
    a) The PRTS compares the repetition control object's repetition counter to the repetition control object's repetition target. If the repetition is deemed complete because the repetition control object's repetition counter has reached the repetition control object's repetition target (checked in operation 1204), the PRTS deletes the repetition control object (operation 1214) and skips operations 7(b)-7(d) below.
    b) If the repetition control object's repetition counter has not reached the repetition control object's repetition target (checked in operation 1204), the PRTS updates the repetition control object by increasing the repetition control object's repetition counter by one (in operation 1206).
    c) Further, the PRTS pushes a pointer to the repetition control object onto the object PDS (operation 1208).
    d) Still further, the PRTS pushes the expression pointer contained in the repeat object pointed to by repetition control object onto the object PDS (operation 1210).

Force Traversal Strategy

Figure 13:
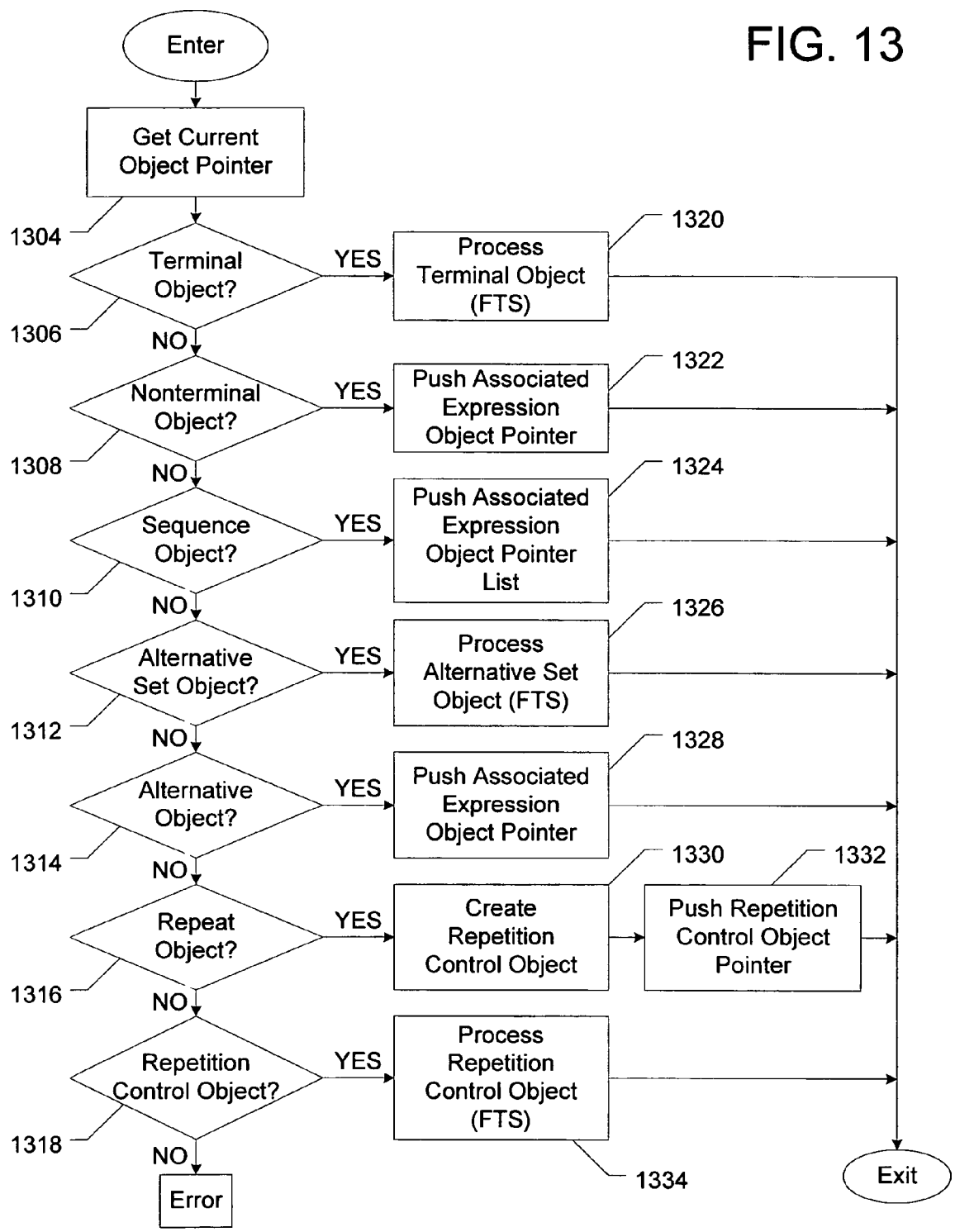
FIG. 13 shows steps in the Force Traversal Strategy.
Figure 14:
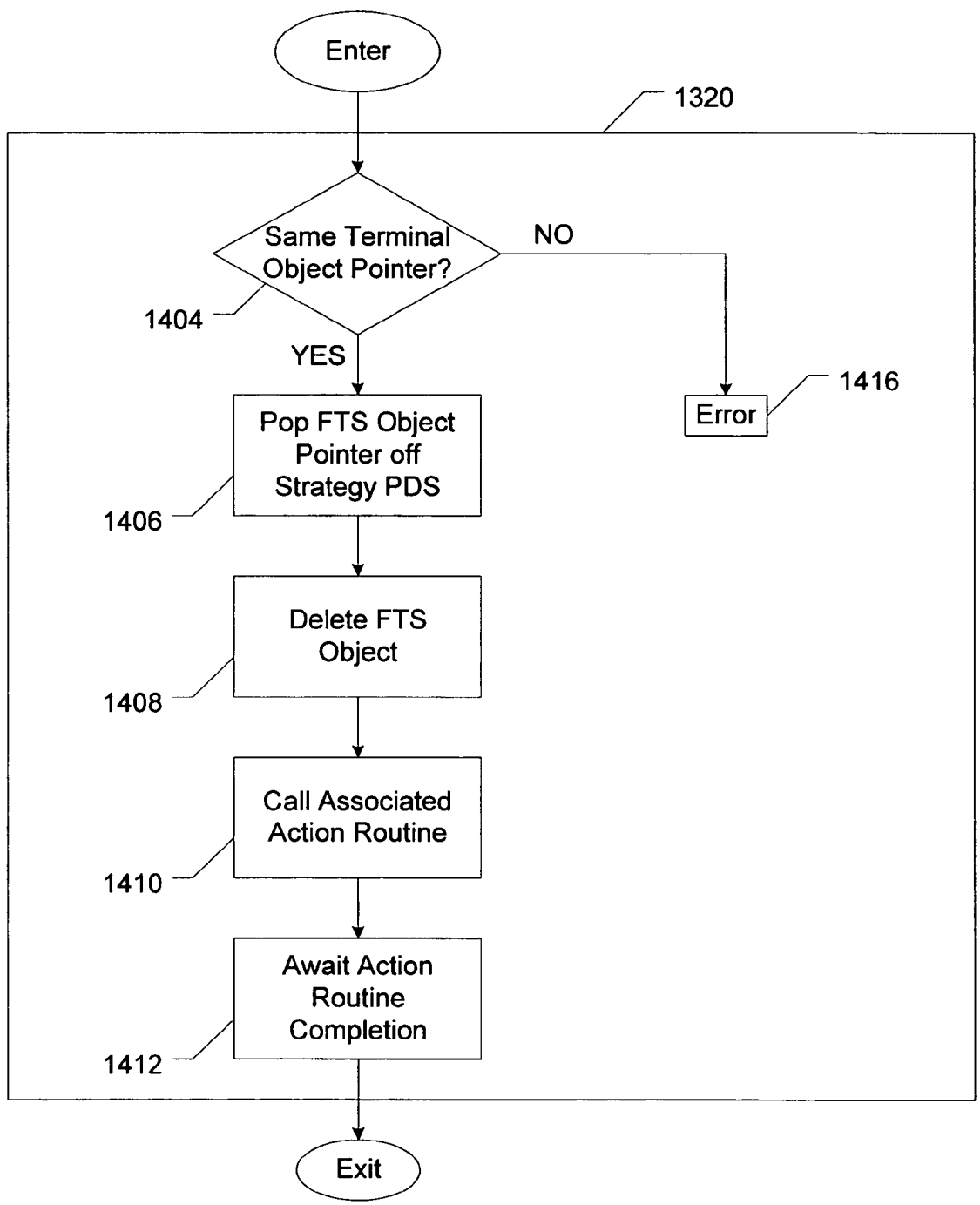
FIG. 14 shows steps in the processing of a Terminal Object by the Force Traversal Strategy.
Figure 15:
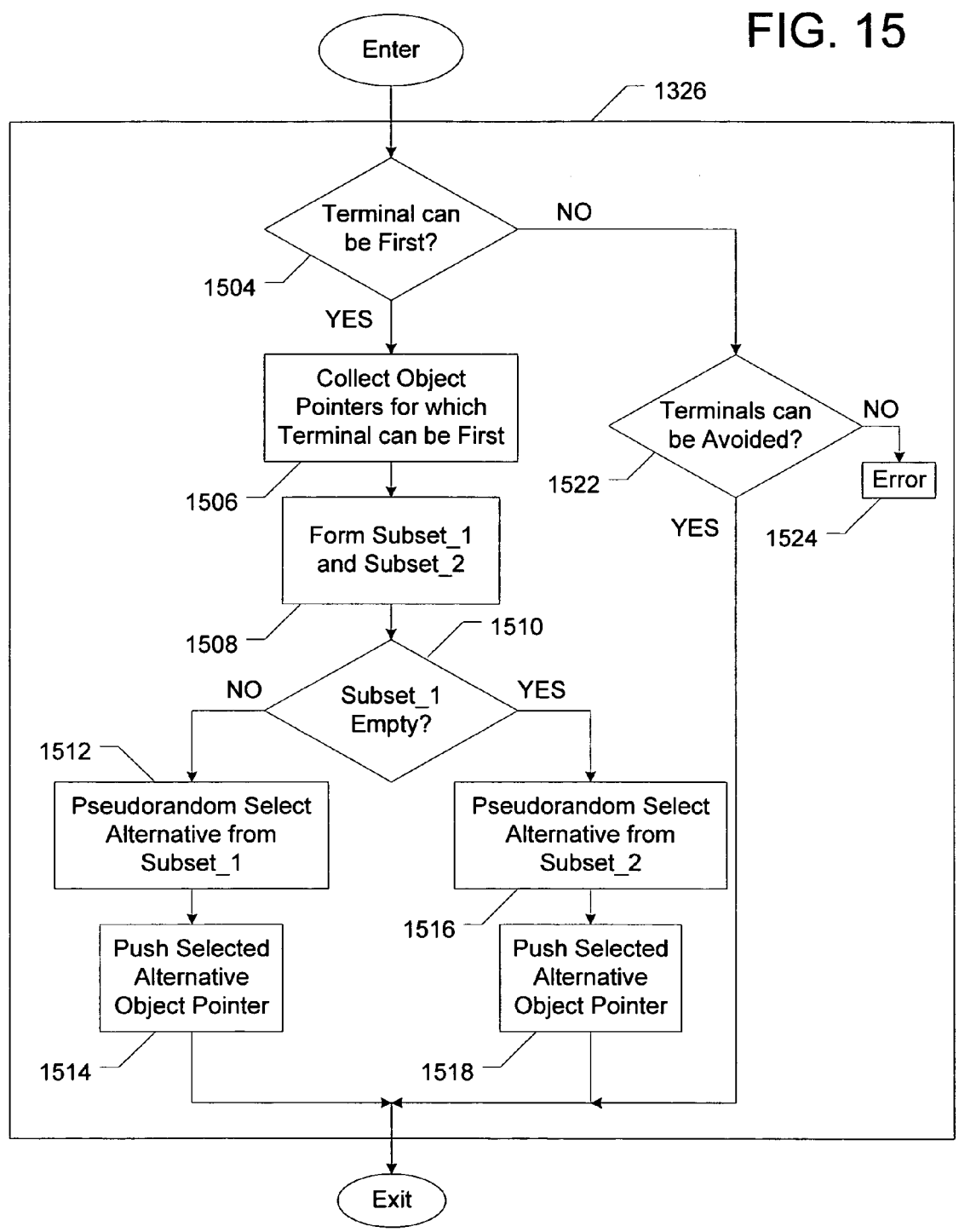
FIG. 15 shows steps in the processing of an Alternative Set Object by the Force Traversal Strategy.
Figure 16:
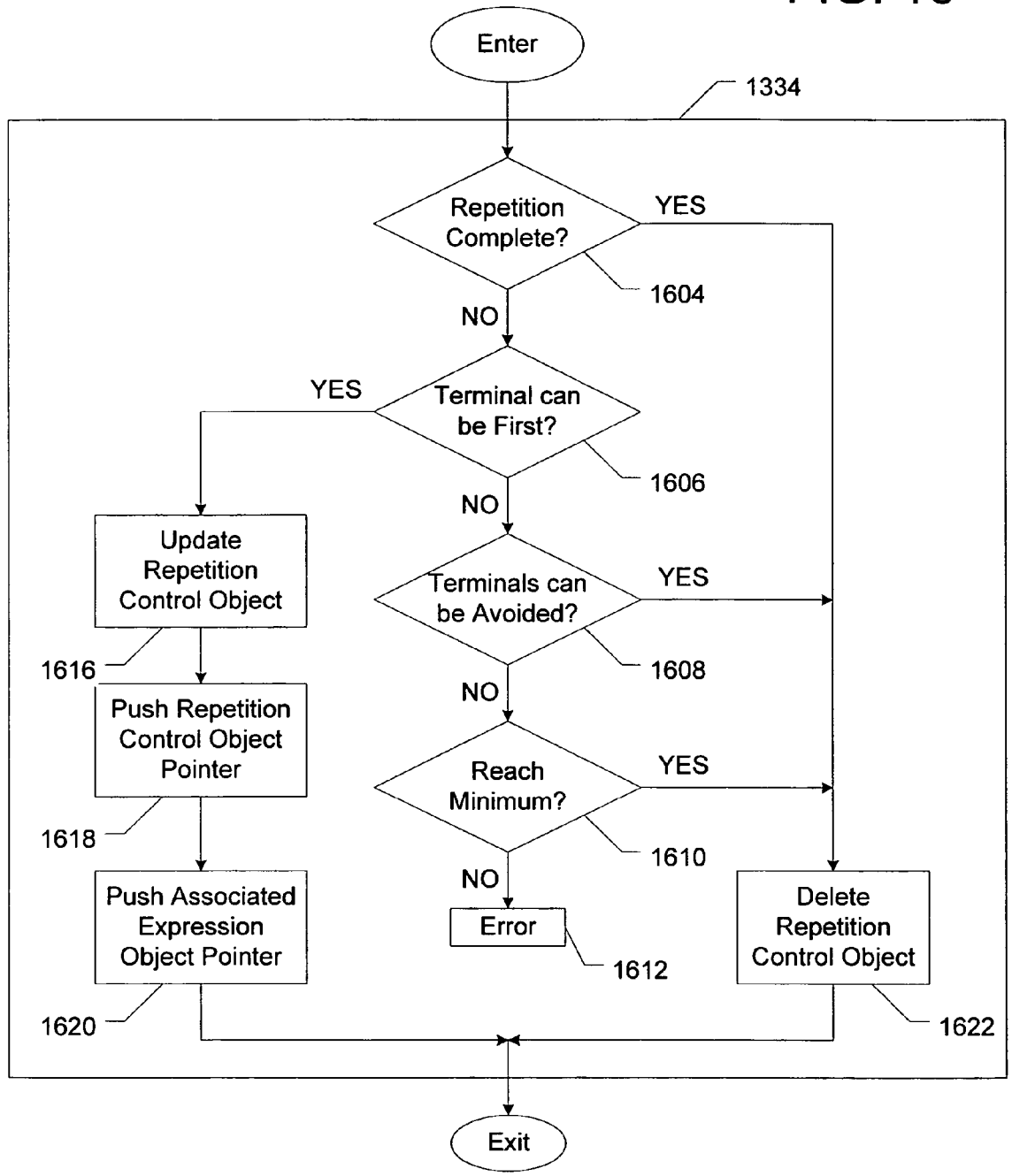
FIG. 16 shows steps in the processing of a Repetition Control Object by the Force Traversal Strategy.

In the dynamic verification phase 110 of a subject embodiment, the force traversal strategy (FTS) processes the current object pointer as described below, as illustrated in FIG. 13. An FTS object has a pointer to a terminal object, known as the force target terminal pointer. The objective of an FTS is that the next terminal object traversed be the one pointed to by the force target terminal pointer.
1. The current object pointer is obtained (operation 1304).
2. If the current object pointer points to a terminal object, the terminal object is processed (operations 1306 and 1320). The FTS compares the terminal object pointer to the force target terminal pointer (operation 1404). If the two pointers are different, the user is notified that an illegal force was done (operation 1416). Otherwise the FTS pops the pointer to its FTS object off the strategy PDS (operation 1406), then deletes the FTS object (operation 1408), then uses the action routine pointer stored in the terminal object (if any) to call the corresponding action routine (operation 1410) and then wait for said action routine to return (operation 1412). This is illustrated in FIG. 14.
3. If the current object pointer points to a non-terminal object, the FTS pushes the pointer to the expression object stored in the non-terminal object onto the object PDS (operations 1308 and 1322).
4. If the current object pointer points to a sequence object, the FTS pushes each expression object pointer in the sequence object's list of expression object pointers onto the object PDS in reverse order (i.e., the expression object pointer at the end of the sequence is pushed onto the object PDS first, and the expression object pointer at the beginning of the sequence is pushed onto the object PDS last) (operations 1310 and 1324).
5. If the current object pointer points to an alternative set object, the alternative set is processed (operations 1312 and 1326). The FTS processes the current object pointer as follows. This is illustrated by operations 1504, 1506, 1508, 1510, 1512, 1514, 1516, 1518, 1522 and 1524 in FIG. 15. The FTS calls TerminalCanBeFirst(force target terminal pointer, current object pointer). For purposes of description, the function return value is herein designated FRV1. If the FRV1 is true, the FTS performs the following three operations.
    a) For each of the alternative object pointers in the alternative set's alternative object pointer list, the FTS calls TerminalCanBeFirst(force target terminal pointer, alternative object pointer), using the results to form the set of alternative object pointers for which the TerminalCanBeFirst function returned true.
    b) The FTS forms two subsets of the set formed in operation 4(a): subset_1 is the subset of alternative object pointers that point to an alternative object with a non-zero weight; subset_2 is the subset of alternative object pointers that point an alternative object with a zero weight.
    c) If Subset_1 is non-empty, the FTS makes a weighted pseudo-random selection of one of the alternative object pointers in Subset_1, and pushes that alternative object pointer onto the object PDS. (The weights used in the weighted pseudo-random selection process are taken from the alternative objects pointed to by the pointers in Subset_1.) If Subset_1 is empty, the FTS makes a non-weighted pseudo-random selection of one of the alternative object pointers in Subset_2, and pushes that alternative object pointer onto the object PDS.
    If FRV1 is false, the FTS calls TerminalsCanBeAvoided (current object pointer). If the function return value is false, the user is notified that an illegal Force was done.
6. If the current object pointer points to an alternative object, the alternative object is processed (operations 1314 and 1328). The FTS pushes the pointer to an expression object stored in the alternative object onto the object PDS.
7. If the current object pointer points to a repeat object, the repeat object is processed (operations 1316, 1330 and 1332). The FTS creates a repetition control object that contains the following data members.
    a) A pointer to the repeat object.
    b) A repetition counter, which is initialized to zero.
    c) A repetition target, which can be a finite number or infinity (i.e., a value which is greater than any possible value of the repetition counter). The repetition target is initialized as follows. If the value of the repeat object's maximum is a finite value, the FTS sets the repetition target to a pseudo-random integer between the repeat object's minimum and the repeat object's maximum (inclusive). If the value of the repeat object's maximum is infinity, the repetition target is initialized to infinity.
d) After creating the repetition control object, the FTS pushes a pointer to that object onto the object PDS.
8. If the current object pointer points to a repetition control object, the repetition control object is processed (operations 1318 and 1334). The FTS processes the current object pointer as follows. This is illustrated by operations 1604, 1606, 1608, 1610, 1612, 1616, 1618, 1620 and 1622 in FIG. 16.
   a) The FTS compares the repetition control object's repetition counter to the maximum contained in the repeat object pointed to by the repetition control object. If the repetition is deemed complete because the repetition control object's repetition counter has reached the maximum contained in the repeat object pointed to by the repetition control object, the FTS deletes the repetition control object and skips operations 7(b)-7(d) below.
   b) The FTS calls TerminalCanBeFirst(force target terminal pointer, current object pointer). If the function return value is true, the FTS updates the repetition control object by increasing the repetition control object's repetition counter by one, then pushes a pointer to the repetition control object onto the object PDS, then pushes the repetition control object's expression pointer onto the object PDS, and then skips operations 7(c)-7(d) below.
   c) The FTS calls TerminalsCanBeAvoided(current object pointer). If the function return value is true, the FTS deletes the repetition control object and skips operation 7(d) below.
   d) The FTS compares the repetition control object's repetition counter to the minimum contained in the repeat object pointed to by the repetition control object. If the repetition control object's repetition counter has reached the minimum contained in the repeat object pointed to by the repetition control object, the FTS deletes the repetition control object. Otherwise the user is notified that an illegal force was done.

Skip Traversal Strategy

Figure 17:
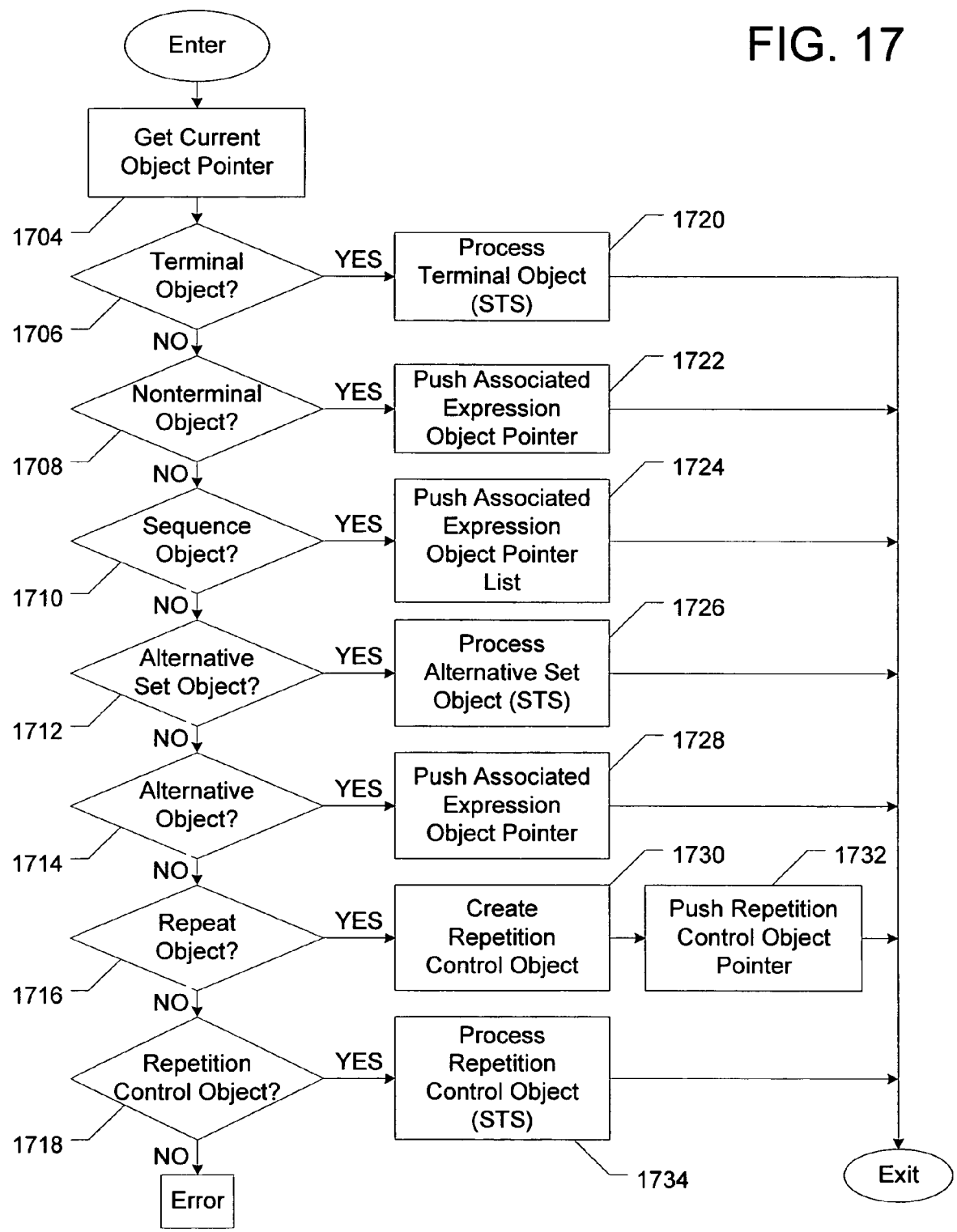
FIG. 17 shows steps in the Skip Traversal Strategy.
Figure 18:
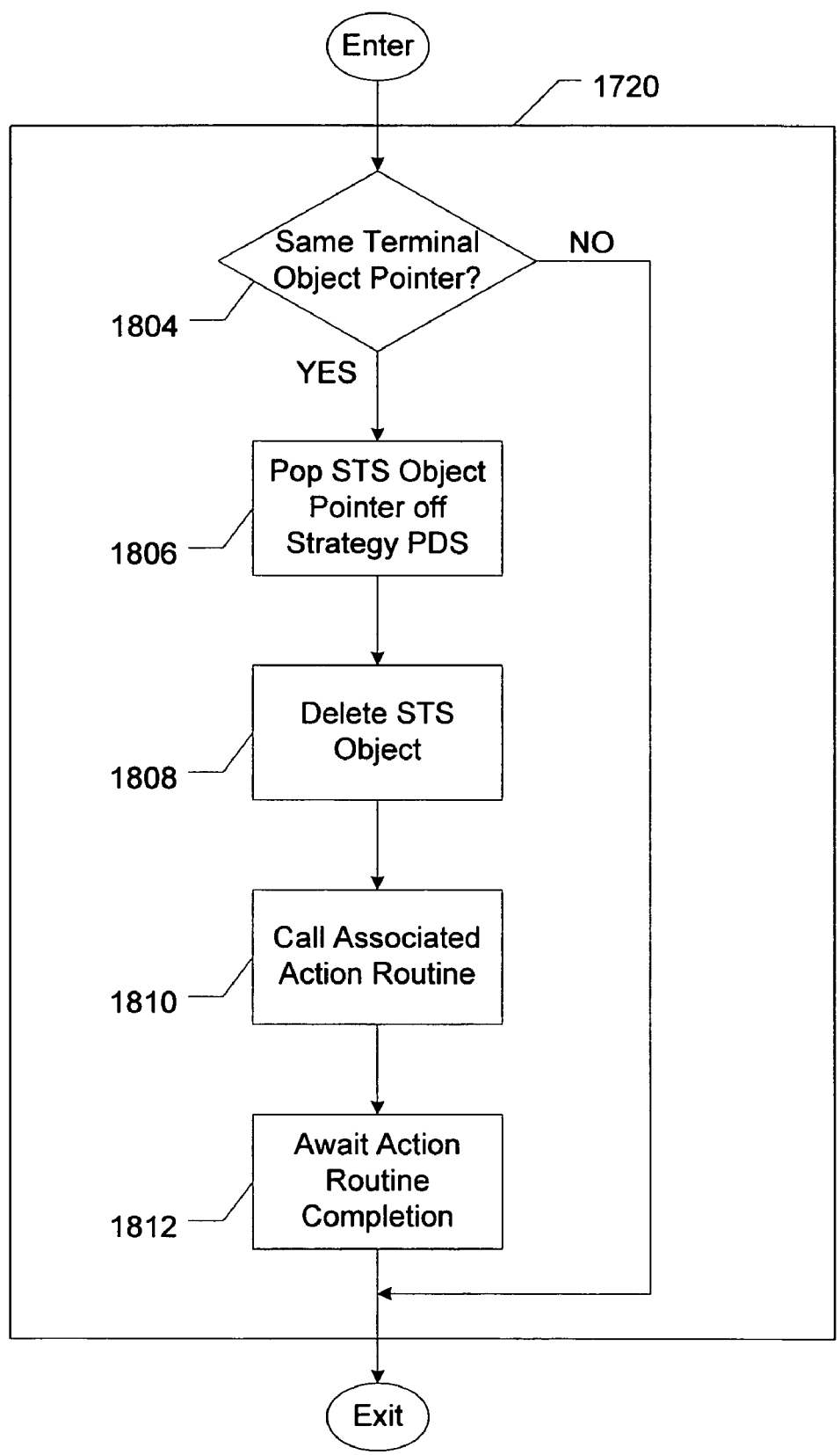
FIG. 18 shows steps in the processing of a Terminal Object by the Skip Traversal Strategy.
Figure 19:
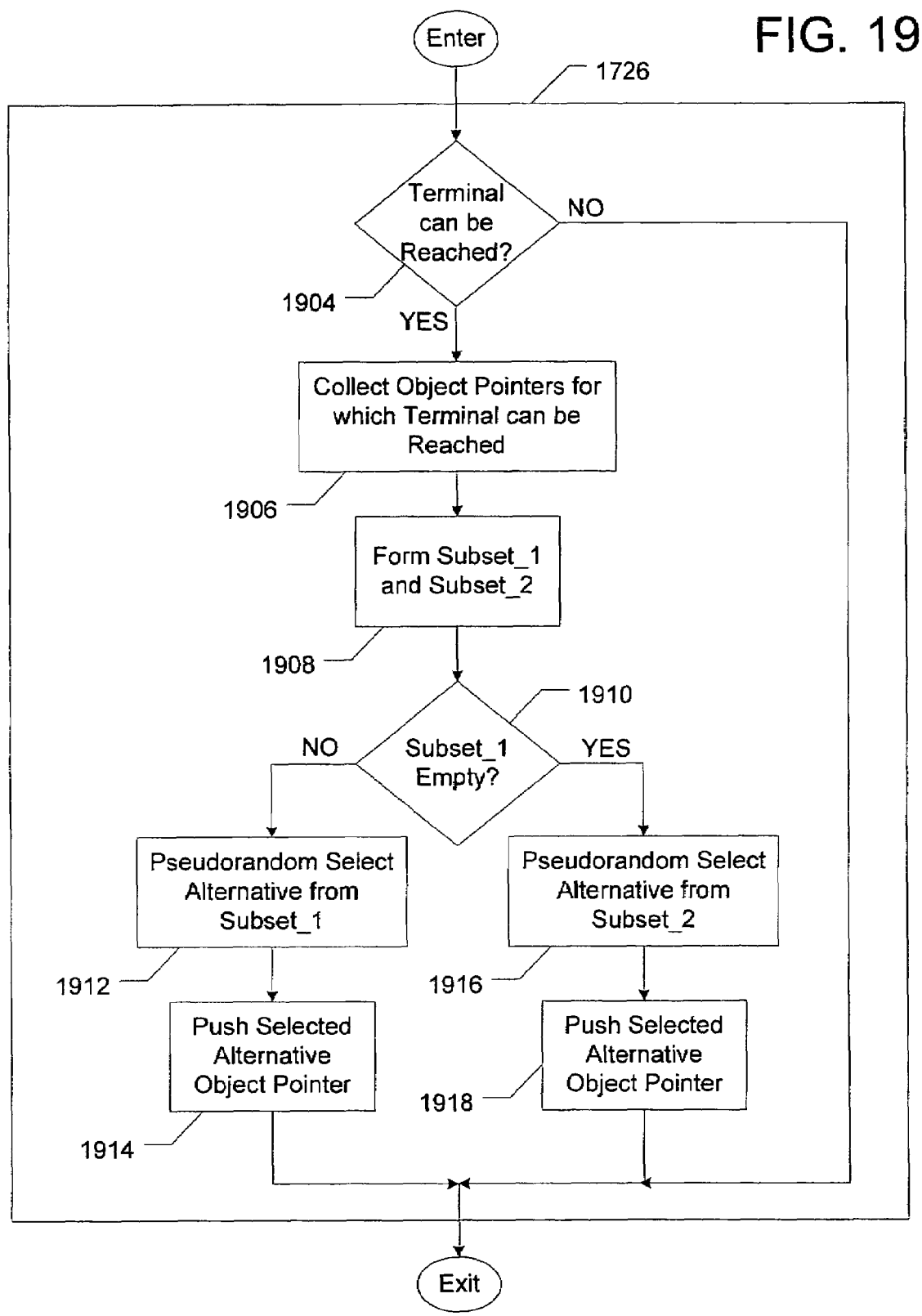
FIG. 19 shows steps in the processing of an Alternative Set Object by the Skip Traversal Strategy.
Figure 20:
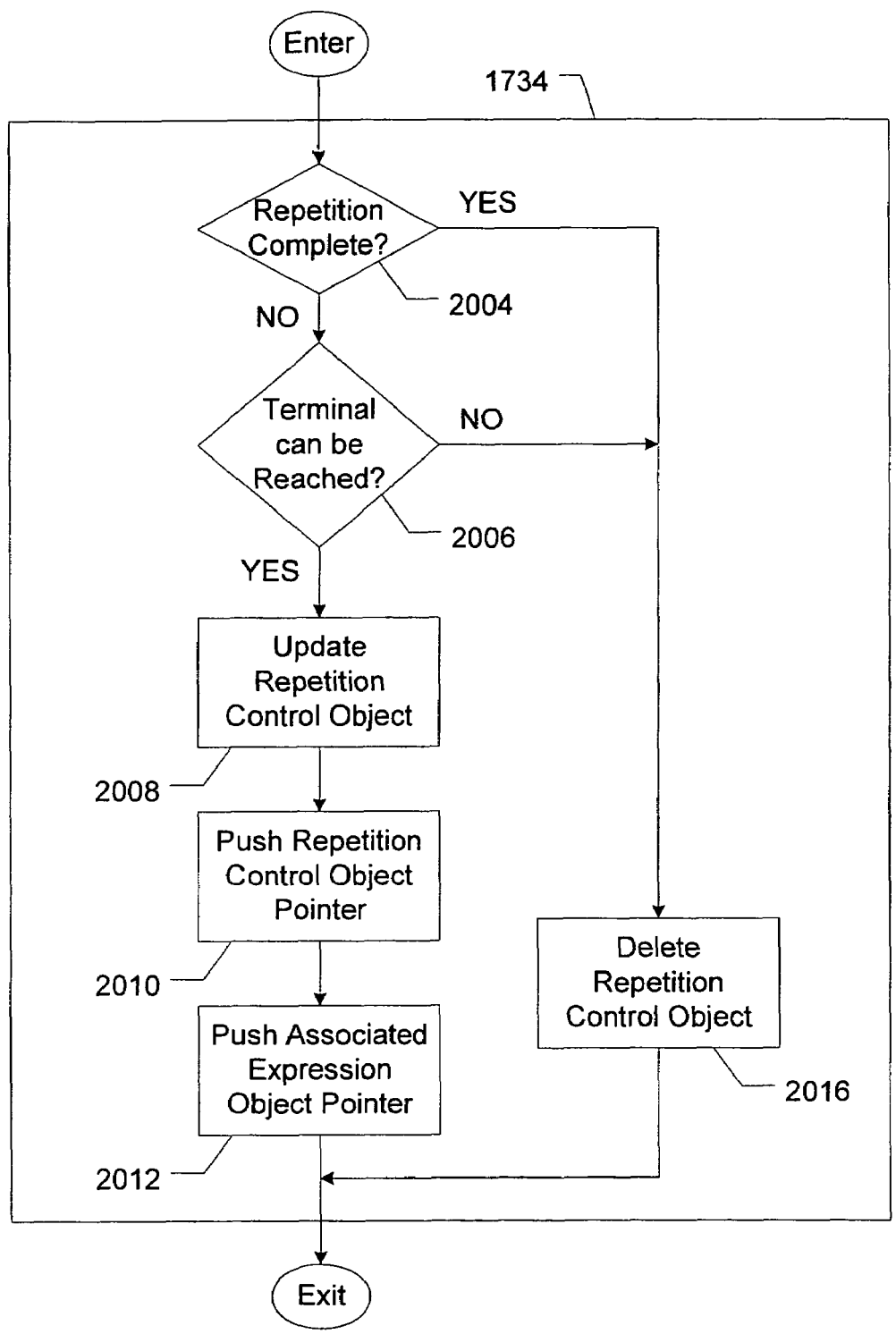
FIG. 20 shows steps in the processing of a Repetition Control Object by the Skip Traversal Strategy.

In the dynamic verification phase 110 of a subject embodiment, the skip traversal strategy (STS) processes the current object pointer as described below. This is illustrated in FIG. 17. An STS object has a pointer to a terminal object, known as the skip target terminal pointer. The objective of an STS is to reach the terminal object pointed to by the skip target terminal pointer, while refraining from calling the action routine for any other terminal object that is traversed before the terminal pointed to by the skip target terminal pointer is reached.
1. The current object pointer is obtained (operation 1704).
2. If the current object pointer points to a terminal object, the terminal object is processed (operations 1706 and 1720). The STS compares the terminal object pointer to the skip target terminal pointer. If the two pointers are identical, the STS pops the pointer to its STS object off the strategy PDS, then deletes the STS object, then uses the action routine pointer stored in the terminal object (if any) to call the corresponding action routine and then wait for said action routine to finish. This is illustrated by operations 1804, 1806, 1808, 1810 and 1812 in FIG. 18.
3. If the current object pointer points to a non-terminal object, the STS pushes the pointer to the expression object stored in the non-terminal object onto the object PDS (operations 1708 and 1722).
4. If the current object pointer points to a sequence object, the STS pushes each expression object pointer in the sequence object's list of expression object pointers onto the object PDS in reverse order (i.e., the expression object pointer at the end of the sequence is pushed onto the object PDS first, and the expression object pointer at the beginning of the sequence is pushed onto the object PDS last) (operations 1710 and 1724).
5. If the current object pointer points to an alternative set object, the alternative set object is processed (operations 1712 and 1726). The STS processes the current object pointer as follows. This is illustrated by operations 1904, 1906, 1908, 1910, 1912, 1914, 1916 and 1918 in FIG. 19. The STS calls TerminalCanBeReached(skip target terminal pointer, current object pointer). If the function returns true, the STS performs the following three operations.
   a) For each of the alternative object pointers in the alternative set's alternative object pointer list, the STS calls TerminalCanBeReached(skip target terminal pointer, alternative object pointer), using the results to form the set of alternative object pointers for which the TerminalCanBeReached function returned true.
   b) The STS forms two subsets of the set formed in operation 4(a): subset_1 is the subset of alternative object pointers that point to an alternative object with a non-zero weight; subset_2 is the subset of alternative object pointers that point an alternative object with a zero weight.
   c) If subset_1 is non-empty, the STS makes a weighted pseudo-random selection of one of the alternative object pointers in subset_1, and pushes that alternative object pointer onto the object PDS. (The weights used in the weighted pseudo-random selection process are taken from the alternative objects pointed to by the pointers in subset_1.) If subset_1 is empty, the STS makes a non-weighted pseudo-random selection of one of the alternative object pointers in subset_2, and pushes that alternative object pointer onto the object PDS.
6. If the current object pointer points to an alternative object, the STS pushes the pointer to an expression object stored in the alternative object onto the object PDS (operation 1714 and 1728).
7. If the current object pointer points to a repeat object, the STS creates a repetition control object that contains the following data members (operations 1716, 1730 and 1732).
   a) A pointer to the repeat object.
   b) A repetition counter, which is initialized to zero.
   c) A repetition target, which can be a finite number or infinity (i.e., a value which is greater than any possible value of the repetition counter). The repetition target is initialized as follows. If the value of the repeat object's maximum is a finite value, the STS sets the repetition target to a pseudo-random integer between the repeat object's minimum and the repeat object's maximum (inclusive). If the value of the repeat object's maximum is infinity, the repetition target is initialized to infinity. After creating the repetition control object, the STS pushes a pointer to that object onto the object PDS.
8. If the current object pointer points to a repetition control object, the repetition control object is processed (operations 1718 and 1734). The STS processes the current object pointer as follows. This is illustrated by operations 2004, 2006, 2008, 2010, 2012 and 2016 in FIG. 20.
   a) The STS compares the repetition control object's repetition counter to the maximum contained in the repeat object pointed to by the repetition control object. If the repetition is deemed complete because the repetition control object's repetition counter has reached the maximum contained in the repeat object pointed to by the repetition control object, the STS deletes the repetition control object and skips operation 7(b) below.

b) The STS calls TerminalCanBeReached(skip target terminal pointer, current object pointer). If the function return value is false, the STS deletes the repetition control object. Otherwise the STS updates the repetition control object by increasing the repetition control object's repetition counter by one, then pushes a pointer to the repetition control object onto the object PDS, and then pushes the repetition control object's expression pointer onto the object PDS.

NDA Traversal Mechanism Control

A subject embodiment includes the following three functions that can be called from action routines 2110 to control the NDA traversal mechanism 2114.

1. When a Force(force target terminal name) function call is made, a new force traversal strategy (FTS) object is created that contains a force target terminal pointer that points to the force target terminal. A pointer to the new FTS object is pushed onto the strategy PDS.
2. When a Skip(skip target terminal name) function call is made, a new skip traversal strategy (FTS) object is created that contains the skip target terminal pointer that points to the skip target terminal. A pointer to the new STS object is pushed onto the strategy PDS.
3. When an AdjustLoopLimit(loop count, loop depth) function call is made, the object PDS is searched in order starting at the top. As soon as the repetition control object pointer corresponding to the depth indicated by loop depth (where 0 indicates the first repetition control object pointer reached in the search) is reached, the search stops. It is an error if there are not at least as many repetition control object pointers in the object PDS as the loop depth value requires. The repetition control object pointed to by the repetition control object pointer is modified by having its repetition target changed to be the same value as its repetition counter plus the given loop count.

Apparatus

Figure 27:
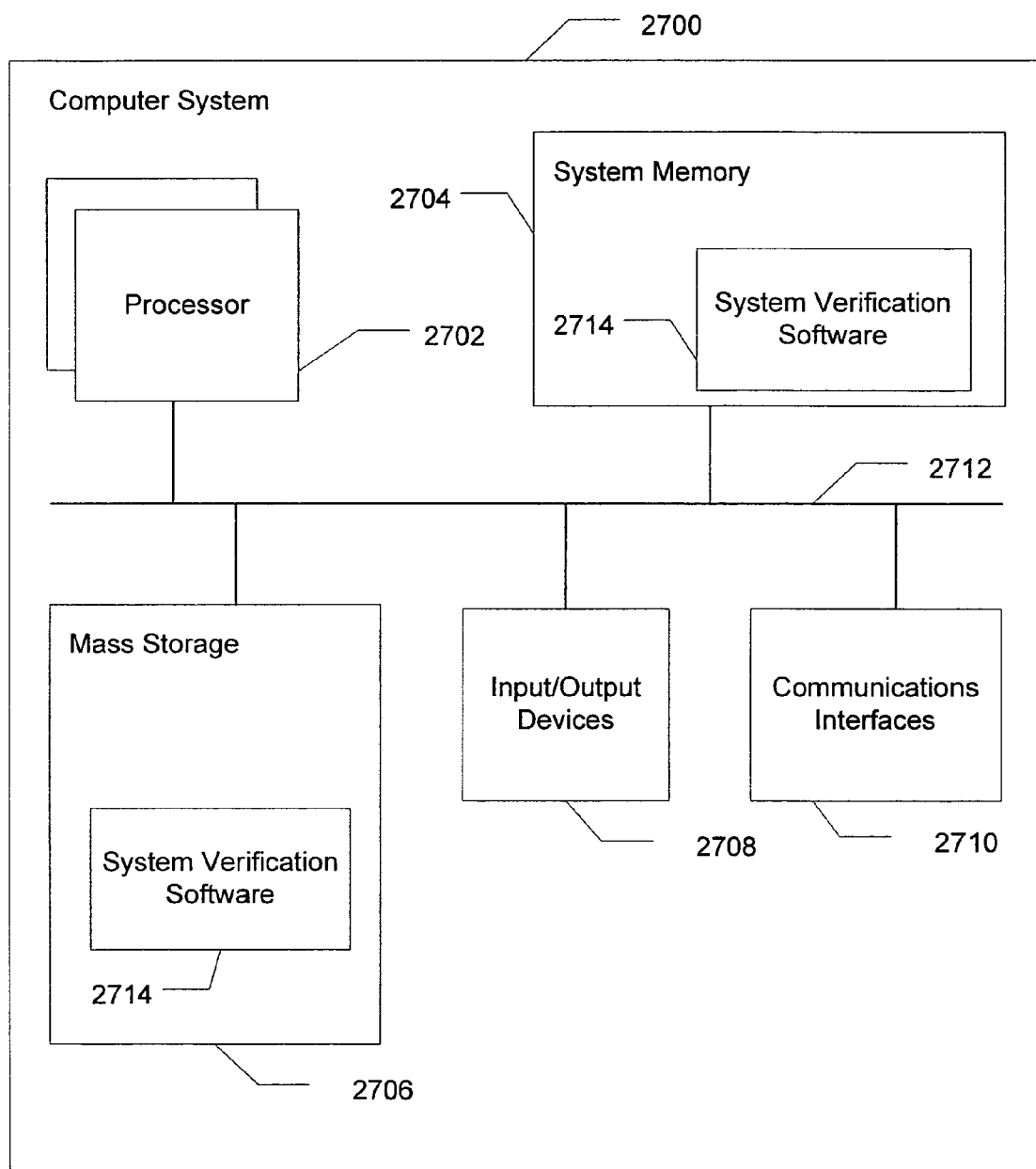
FIG. 27 shows a Computer System suitable for use as a computing device to practice a subject embodiment.

FIG. 27 illustrates an example computer system suitable for use as a computing device to practice a subject embodiment of the present invention. The computing system may be used by itself, in a pair or in a group of multiple ones. In the first case, the computing system may be adopted with all programming instructions to practice the invention, whereas in the latter cases, each system may be endowed with a selected portion of the programming instructions to practice one or more selected aspects of the invention. When multiple systems are used, the systems may be directly coupled to each other, through a local and/or wide area network, which may include one or more public networks, including the Internet.

As shown, computer system 2700 includes one or more processors 2702 and system memory 2704. Additionally, computer system 2700 includes mass storage devices 2706 (such as diskette, hard drive, CDROM and so forth), input/output devices 2708 (such as keyboard, cursor control, and so forth) and communication interfaces 2710 (such as interface to the system under test, network interface cards, modems and so forth). The elements are coupled to each other via system bus 2712, which represents one or more buses. In the case of multiple buses, they may be bridged by one or more bus bridges (not shown).

Each of these elements performs its conventional functions known in the art. In particular, system memory 2704 and mass storage 2706 are employed to store a working copy and a permanent copy of the programming instructions implementing the system verification system 2714 of the present invention, in whole or in part. The permanent copy of the programming instructions may be loaded into mass storage 2706 in the factory, or in the field, through a distribution medium (not shown) or through communication interface 2710 (from a distribution server (not shown)). The constitution of these elements 2702-2712 are known, and accordingly will not be further described.

Conclusion

The foregoing detailed description has disclosed an embodiment for accomplishing system verification using novel NDA techniques for dealing with the complexities of the behavior of NDS systems. We have disclosed information sufficient to enable the making and using of the present invention without further invention or excessive experimentation. It will be apparent that many other implementations of the present invention can be made which employ the principles disclosed herein and that the present invention can be used not only in system verification, but in any context where there is a need for dealing with the complexities of the behavior of NDS systems.

While the above detailed description contains many specifics, these should not be construed as limitations on the scope of the invention, but rather as an exemplification of an embodiment thereof. Many other variations are possible.

For example, the compliance assessment protocol design phase may be replaced, abridged, or supplemented by an alternative method for obtaining verification information, such as loading verification modules from a database or extracting verification information from a system specification.

For example, the compilation phase may be replaced, abridged, or supplemented by an alternative method for providing the functionality represented by the action routines 2110, such as interpreting instructions instead of compiling them or template references indicating functionality from a database of alternatives.

For example, the information presented in the VID may be presented in some alternative form or forms, such as a graphical information capture system, user written modules, or generation from a system specification.

For example, the information presented in the dynamic verification run initialization file may be presented in some alternative form or forms, such as annotations in a verification testbench or options specified when the hardware simulator is invoked.

For example, the system that is to be verified may represented as a physical device such as a microprocessor, an automotive control system, or an avionic control system.

For example, the DUT 118 may include a multi-threaded software system such as a database management and/or access system, a real-time software system such as an industrial process control operating program, or a general-purpose software operating system.

For example, if the DUT 118 is used with a simulator in a dynamic verification run 2100, the simulator may be multi-threaded.

For example, the verification environment may include a simulator implemented in software, a hardware emulator or accelerator system, a test interface mechanism for connection to a physical device, an embedded program execution environment and/or device, or any mixture or combination of a plurality of such mechanisms.

For example, the verification operations performed on the DUT 118 need not be limited to reading and writing zeroes and ones but could include arbitrary data representations including multi-state logic, integers, or real or floating point numbers.

For example, the verification operations performed on the DUT 118 need not be limited to software operations but could include physical actions such as the opening and closing of valves, the reading of the state and/or values of sensors such as those for temperature, pressure, humidity, and the like, or the triggering of physical actions.

For example, the NDA 2104 may not be represented in an explicit automaton form, but rather in some substantially equivalent form such as one or more graphs, tables, or the like.

For example, the NDA 2104 may not be grammar-like with terminals, non-terminals, etc., but rather expressed in terms of nodes or states, arcs or transitions, etc.

For example, the NDA 2104 may have additional information embedded within it which extends the graph representation, such as control expressions that affect loop expansion.

For example, the NDA 2104 may have additional information embedded within it which can be passed to action routines 2110, such as an indication of the current state of the NDA traversal 1002.

For example, the set of NDA construction primitives could be extended from the present alternative, sequence, and so forth to include further primitives such as single-occurrence-of-item or regular expression operators.

For example, the set of NDA construction primitives could be factored to exclude items from the present primitive set since an equivalent expressive power could still be derived using the recombinations of the remaining items.

For example, the action routines 2110 may not be associated with terminals, but rather with nodes, states, arcs, transitions, or the like in an alternative NDA representation as has been mentioned.

For example, the NDA 2104 may be modified not only by the mechanisms described but also by providing mechanisms for adding or deleting an arc to or from the NDA, adding or deleting a node or state to or from the NDA, or adding or deleting or changing an action routine and/or the point at which the action routine is connected.

For example, the identification of the alternative to be selected could be indicated by the result of calling a function supplied by the user instead of using a fixed weighting factor. This function could have any of a range of information made available to it for driving its computation. The function could be different for each alternative, alternative set, or NDA 2104.

For example, additional traversal strategies beyond pseudo-random, force, and skip could be supplied, such as a coverage-based strategy or a deterministic strategy possibly under the control of the user.

For example, the selection of an alternative could be affected not only by a single traversal strategy but also by a method that combines the results of multiple traversal strategies. Many combination methods are possible, such as priority-based, weighted averaging, or majority voting.

For example, the NDA 2104 or portions thereof may be entered by alternative means such as of a graphical user interface representation of the automaton, a text-based grammar file, a construction method in a programming language other than C++, or a translation from a formal verification specification and/or language.

For example, the NDA 2104 and the DUT 118 may be synchronized by methods in addition to the already-described WAIT_FOR synchronization directives, such as fork-and-join constructs, semaphore methods, interrupt signaling, or polling.

For example, NDA traversal 1002 may be constrained by not only the aforementioned mechanisms but also by requiring any of a set of next terminals to be traversed or a series or set of series of next terminals to be traversed.

For example, NDA traversal 1002 could be selected based on the result of a "goodness" measure supplied by a user function.

For example, an NDA traversal mechanism 2114 may have traversal constraints applied to non-terminals.

For example, NDA traversal mechanism 2114 may have traversal constraints applied using additional knowledge embedded in the NDA 2104.

For example, the selection of an alternative from an alternative set may be accomplished without use of the TerminalCanBeReached, TerminalCanBeFirst, and TerminalsCanBeAvoided functions by, for example, speculative selection with backtracking or processing the NDA 2104 to add permissible selections information.

For example, the processing of loops may be accomplished without the use of the repetition control object by, for example, unrolling the contents of a loop into a straight-line implementation or by using a nested function call decomposition implementation.

For example, the NDA traversal 1002 of the NDA 2104 may be accomplished without the use of the object PDS by, for example, adding history information to the NDA as a traversal progresses or transforming the NDA into a hardware, software, or hybrid engine that implicitly or explicitly includes the NDA graph information.

For example, the structuring of the traversal strategies may be accomplished without the use of the strategy PDS by, for example, using a priority queue or an alternate flow of control such as nested execution of strategies.

For example, the traversal strategy may not be explicitly represented, but, for example, implemented as an implicit attribute of the NDA traversal mechanism 2114.

For example, a directive may be implemented by a function call, an inter-process communication call, a goto, a long jump or any other mechanism by which the flow of control of software execution may be specified.

For example, the execution of the various computer tasks could be accomplished not only by threads, but also in separate processes, lightweight processes, or any other execution mechanism that provides a context or other means for preserving the state of a computation.

For example, the execution of the various computer tasks could take place not only in a single processor environment, but also across multiple processors or processing elements sharing memory or otherwise communicating information, across multiple separate machines configured in a network or otherwise communicating information, and the like.

For example, there may be local or limited access resource pools that are available in addition to the global resource pool (i.e. set of resources 2204).

For example, set of resources 2204 could have a resource or resources added to it during dynamic verification 112.

For example, set of resources 2204 could have a resource or resources removed from it during dynamic verification 112.

For example, the number of a given kind of resource could be increased or decreased during dynamic verification 112.

For example, the properties of a resource or resources could be changed during dynamic verification 112.

For example, a resource or resources could have properties added or deleted during dynamic verification 112.

For example, a set of resources could be acquired at one time, either as all all-or-none proposition or as a subset.

For example, if a resource or resources are not available when requested, the requestor could be queued to wait until they are available.

For example, the queuing of requesters for resources could be made on a priority or other request ordering basis as well as first-come, first-served.

For example, the owner of a resource could be forced to relinquish said resource if so demanded by another requestor.

For example, resources could be organized in a hierarchy wherein a request can be made for a portion of the resource instead of the entire resource.

For example, reference has been made to programming in C++. It is also possible to use other computer languages such as C, Java, Pascal, ADA, and the like.

For example, reference has been made to interacting with the hardware description language simulator NC-Verilog™. Other hardware description language simulators such as ModelSim™, VCS™, and the like may also be used.

For example, reference has been made to interacting with a hardware description language simulator. Interaction with other kinds of simulators such as behavioral simulators, instruction set simulators, gate-level simulators, and the like is also possible.

All of the above being the case, the foregoing detailed description is to be understood as being in every respect illustrative and exemplary, but not restrictive, and the scope of the invention disclosed herein is not to be determined from the detailed description.

What is claimed is:

1. A method comprising:
    traversing at least one non-deterministic automaton on one or more computing devices, as part of a dynamic verification of a device under test;
    receiving a directive to modify said at least one non-deterministic automaton in the course of said traversing;
    pausing said traversing, and modifying said at least one non-deterministic automaton as directed; and
    resuming said traversing of said at least one non-deterministic automaton.

2. The method of claim 1, wherein said receiving comprises receiving said directive from a task performing a test computation as part of said dynamic verification of said device under test.

3. The method of claim 2, wherein said task, when deciding whether to issue said directive, takes into consideration information derived from behavior of said device under test during said dynamic verification.

4. The method of claim 3, wherein said behavior of said device under test during said dynamic verification is non-deterministic to said task.

5. The method of claim 4, wherein said task is intrinsic to said traversing of said at least one non-deterministic automaton.

6. The method of claim 4, wherein said task is extrinsic to said traversing of said at least one non-deterministic automaton.

7. The method of claim 1, wherein said device under test is a device selected from the group consisting of an electronic device, a model of an electronic device, and a design of an electronic device.

8. A method comprising:
    traversing at least one non-deterministic automaton on one or more computing devices, as part of a dynamic verification of a device under test;
    receiving a directive to modify a set of constraints on said traversing in the course of said traversing;
    pausing said traversing, and modifying said set of constraints as directed; and resuming said traversing of said at least one non-deterministic automaton.

9. The method of claim 8, wherein said receiving comprises receiving said directive from a task performing a test computation as part of said dynamic verification of said device under test.

10. The method of claim 9, wherein said task, when deciding whether to issue said directive, takes into consideration information derived from behavior of said device under test during said dynamic verification.

11. The method of claim 10, wherein said behavior of said device under test during said dynamic verification is non-deterministic to said task.

12. The method of claim 11, wherein said task is intrinsic to said traversing of said at least one non-deterministic automaton.

13. The method of claim 11, wherein said task is extrinsic to said traversing of said at least one non-deterministic automaton.

14. The method of claim 8, wherein said device under test is a device selected from the group consisting of an electronic device, a model of an electronic device, and a design of an electronic device.

15. A method comprising:
    providing a traversal mechanism for traversing at least one non-deterministic automaton on one or more computing devices;
    traversing said at least one non-deterministic automaton using said traversal mechanism, as part of a dynamic verification of a device under test;
    receiving a directive to modify said traversal mechanism in the course of said traversing;
    pausing said traversing, and modifying said traversal mechanism as directed; and
    resuming said traversing of said at least one non-deterministic automaton.

16. The method of claim 15, wherein said receiving comprises receiving said directive from a task performing a test computation as part of said dynamic verification of said device under test.

17. The method of claim 16, wherein said task, when deciding whether to issue said directive, takes into consideration information derived from behavior of said device under test during said dynamic verification.

18. The method of claim 17, wherein said behavior of said device under test during said dynamic verification is non-deterministic to said task.

19. The method of claim 18, wherein said task is intrinsic to said traversing of said at least one non-deterministic automaton.

20. The method of claim 19, wherein said task is extrinsic to said traversing of said at least one non-deterministic automaton.

21. The method of claim 15, wherein said device under test is a device selected from the group consisting of an electronic device, a model of an electronic device, and a design of an electronic device.

22. An apparatus comprising:
a storage medium having stored therein programming instructions adapted to enable said apparatus to practice the following method:
- traversing at least one non-deterministic automaton on one or more computing devices, as part of a dynamic verification of a device under test;
- receiving a directive to modify said at least one non-deterministic automaton in the course of said traversing;
- pausing said traversing, and modifying said at least one non-deterministic automaton as directed; and
- resuming said traversing of said at least one non-deterministic automaton; and one or more processors coupled to said storage medium to execute said programming instructions.

23. The apparatus of claim 22, wherein said storage medium comprises first and second storage units respectively having first and second subsets of said plurality of programming instructions; and said one or more processors comprise a first and a second processor, coupled to each other, and correspondingly coupled to said first and second storage units to respectively execute said first and second subsets of programming instructions.

24. The apparatus of claim 23, wherein said first and second processors are coupled to each other through a network connection.

* * * * *